(12) United States Patent
Kurokawa

(10) Patent No.: US 7,192,788 B2
(45) Date of Patent: Mar. 20, 2007

(54) SEMICONDUCTOR DEVICE AND MANUFACTURING METHOD OF THE SAME

(75) Inventor: Atsushi Kurokawa, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/007,340

(22) Filed: Dec. 9, 2004

(65) Prior Publication Data

US 2005/0127393 A1   Jun. 16, 2005

(30) Foreign Application Priority Data

Dec. 12, 2003   (JP)   ............................. 2003-414714

(51) Int. Cl.
*H01L 21/331*   (2006.01)
(52) U.S. Cl. .................. 438/3; 257/303; 257/528; 257/E21.011; 257/E21.703; 438/309; 438/311
(58) Field of Classification Search ................ 257/303, 257/528; 438/3, 309, 396
See application file for complete search history.

(56) References Cited

U.S. PATENT DOCUMENTS 5,736,776 A * 4/1998 Yamamoto et al. ......... 257/532
6,777,776 B2 * 8/2004 Hieda .......................... 257/532
6,815,222 B2 * 11/2004 Ejiri ............................... 438/3
6,876,056 B2 * 4/2005 Tilmans et al. ............. 257/528

FOREIGN PATENT DOCUMENTS

| JP | 2001-077204 | 3/2001 |
| JP | 2001-156179 | 6/2001 |
| JP | 2001-326284 | 11/2001 |
| JP | 2002-252344 | 9/2002 |

* cited by examiner

*Primary Examiner*—Andy Huynh
*Assistant Examiner*—Dao H. Nguyen
(74) *Attorney, Agent, or Firm*—Mattingly, Stanger, Malur & Brundidge, P.C.

(57) ABSTRACT

The present invention intends to provide a technique that can improve the capacitance density while securing the withstand voltage of a capacitor element. In order to achieve the above object, the present inventive manufacturing method of a semiconductor device includes forming a metal film on a silicon oxide film, forming a SiN film on the metal film, forming a metal film on the SiN film, etching the upper most metal film with a photoresist film as a mask to form an upper electrode, thereafter forming a silicon oxide film that covers the upper electrode, patterning by etching the silicon oxide film and the SiN film with a photoresist film as a mask to form a capacitor insulating film and sputter-etching the lowermost metal film with the patterned silicon oxide film as a mask to form a lower electrode.

9 Claims, 19 Drawing Sheets

SEMICONDUCTOR DEVICE AND MANUFACTURING METHOD OF THE SAME

BACKGROUND OF THE INVENTION

1. Field of the Invention

The present invention relates to a semiconductor device and a manufacturing method of the same. In particular, the present invention relates to a technique effective in applying in a formation process of a capacitor element that is formed integrated with a transistor and a resistance element on a substrate.

2. Description of the Related Art

For instance, in patent literatures 1, 2, 3 and 4, a technique in which an HBT (Hetero-junction Bipolar Transistor), a resistance element and a capacitor element are formed on the same substrate is disclosed.

Patent literature 1: JP-A No. 2001-77204
Patent literature 2: JP-A No. 2001-326284
Patent literature 3: JP-A No. 2001-156179 and
Patent literature 4: JP-A No. 2002-252344

An HBT is considered being studied for use in a high-output power amplifier as a high-output power device capable of operating under a single power supply. In addition, since the HBT has the characteristics of being capable of being operated with high efficiency, etc., a technique for applying in a mobile communication device such as a portable telephone is under consideration. In the case of the HBT being applied to the mobile communication device, not only making the performance of the HBT element higher, but also miniaturizing a semiconductor chip (hereinafter simply referred to as chip) on which the HBT is formed, and forming a passive element such as a resistance element or a capacitor element and the HBT in the same chip are demanded.

The present inventors are studying an HBT that is used in a high-frequency module contained in a mobile communication device and also studying a technique of forming the HBT together with passive elements such as a resistance element and a capacitor element in one chip. In the course, the inventors found problems mentioned below. These problems will be explained with reference to FIGS. 39 and 40.

FIG. 39 is an essential sectional view of one example of a chip that the inventors have studied. Although in the chip, an HBT and passive elements such as a resistance element and a capacitor element are formed, in FIG. 39 a cross section of a capacitor element is illustrated. A process that forms a capacitor element in a chip and was studied by the inventors is as follows. On an insulating film 102 that is deposited on a semi-insulating substrate (hereinafter simply referred to as a substrate) 101 that has, for instance, GaAs (gallium arsenide) as a main component, a metal film 103 is formed and the metal film 103 is patterned. Subsequently, after on the substrate 101, an interlayer insulating film 104 that covers the metal film 103 is deposited, an opening 105 that reaches the metal film 103 is formed in the interlayer insulating film 104. In the next place, after an insulating film 106 is deposited on the interlayer insulating film 104 including the inside of the opening 105 thereof, the insulating film 106 is patterned. Subsequently, after a metal film 107 is deposited on the substrate 101, the metal film 107 is patterned. Thereby, a capacitor element C11 is formed in which the metal film 103 is a lower electrode, the insulating film 106 is a capacitor insulating film and the metal film 107 is an upper electrode. The inventors found that when a capacitor element C11 is formed according to such a process, the insulating film 106 bends in a lower region 105A of a sidewall of the opening 105 and a film thickness becomes thinner than other regions or film quality is deteriorated. When the film thickness of the insulating film 106 becomes thinner, the withstand voltage of the capacitor element C11 is deteriorated in the lower region 105A; accordingly, there is a problem in that a measure of improving a capacitance density of the capacitor element C11 by thinning a film thickness of the insulating film 106 cannot be taken. Furthermore, depending on the deposition conditions of an insulating film, an insulating film can be formed without reducing a film thickness in the lower region 105A. However, even in such cases, often times deterioration of film quality is caused. That is, owing to the deterioration of the film quality, a phenomenon that the withstand voltage at the region 105A deteriorates to not more than half of the withstand voltage at a planar portion is likely to occur. This is because although a plasma CVD (Chemical Vapor Deposition) device or the like is used to form an insulating film, the film quality and a film thickness at a stepped portion can be controlled with more difficulty in comparison with that in a planar portion. Furthermore, when the capacitor element C11 is formed, a process of forming the opening 105 and a process of patterning the insulating film 106 are necessary. Accordingly, there is another problem in that the number of processes for manufacturing a chip increases.

FIG. 40 is an essential sectional view of another example of a chip that the inventors studied. Also, in a chip shown in FIG. 40, similarly to the chip shown in FIG. 39, an HBT and passive elements such as a resistance element and a capacitor element are formed. However, in FIG. 40, a sectional view of a capacitor element is illustrated. A process that forms a capacitor element in the chip and was studied by the inventors is same as that for the chip explained with FIG. 39 up to a process of patterning the metal film 103. Thereafter, an insulating film 106 is deposited on a substrate 101. Subsequently, after a metal film 107 is deposited on the insulating film 106, the metal film 107 is patterned. Thereby, a capacitor element C11 is formed in which the metal film 103 is a lower electrode, the insulating film 106 is a capacitor insulating film and the metal film 107 is an upper electrode. In the example shown in FIG. 40, the insulating film 106 combines with an interlayer insulating film as well. The inventors found that when a capacitor element C11 is formed according to a process like this, in a region 103A of a sidewall lower portion of the metal film 103, a sidewall portion and a region up to a region 103B of a sidewall upper portion, a film thickness of the insulating film 106 becomes thinner than other regions or film quality is likely to deteriorate. Thus, when, in depositing the insulating film 106, the insulating film 106 becomes partially thinner or the film quality deteriorates, similarly to an example shown in FIG. 37, there is a problem in that a measure of improving the capacitance density of the capacitor C11 by thinning a film thickness of the insulating film 106 can be taken with difficulty.

An object of the present invention is to provide a technology that can improve the capacitance density while securing the withstand voltage of a capacitor element.

The above-mentioned and other objects and novel characteristics according to the present invention will be clarified from descriptions in the present specification and attached drawings.

SUMMARY OF THE INVENTION

Among inventions that will be disclosed in the present application, representative outlines are briefly explained as follows.

A semiconductor device according to the present invention includes a capacitor element that is formed on a substrate made of a semiconductor substrate or an insulator substrate; the capacitor element having a lower electrode formed on the substrate, a capacitor insulating film formed on the lower electrode and an upper electrode formed on the capacitor insulating film; the lower electrode, the capacitor insulating film and the upper electrode being formed flat on the substrate; and in a plane an outer periphery of the upper electrode being disposed more inside than an outer periphery of the lower electrode.

Furthermore, a manufacturing method according to the present invention of a semiconductor device includes (a) sequentially depositing on a substrate made of a semiconductor substrate or an insulator substrate a first conductive film, a first insulating film and a second conductive film, (b) patterning the second conductive film to form an upper electrode, and (c) after the step (b), patterning the first conductive film to form a lower electrode and thereby forming a capacitor element including the upper electrode, the capacitor insulating film and the lower electrode.

Among inventions that will be disclosed in the present application, an effect that is obtained according to typical one is briefly described as follows.

That is, with securing the withstand voltage of a capacitor element the capacitance density can be improved.

DESCRIPTION OF THE PREFERRED EMBODIMENTS

Figure 1:
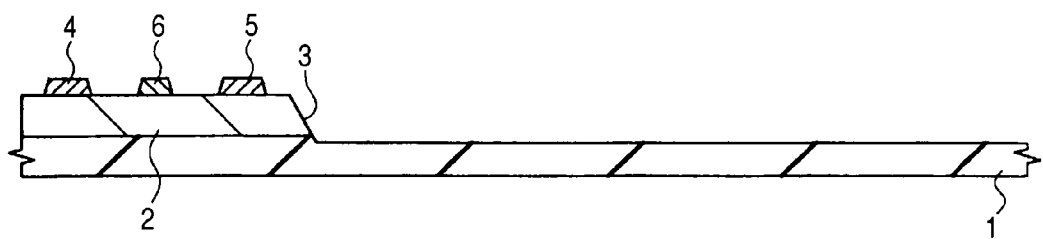
FIG. 1 is an essential sectional view for explaining a manufacturing method of a semiconductor device that is embodiment 1 according to the present invention.

In what follows, embodiments according to the present invention will be detailed based on the drawings. In all drawings for explaining the embodiments, as a general rule, to identical members, identical reference numerals are given and repetition of explanation thereof will be omitted.

(Embodiment 1)

In a semiconductor device according to embodiment 1, for instance, a FET (FieldEffect Transistor), a resistance element and a capacitor element are integrally formed on a substrate. A manufacturing process of the semiconductor device according to the embodiment 1 will be explained along a manufacturing process with reference to FIGS. 1 through 13.

Firstly, as shown in FIG. 1, a semi-insulating GaAs substrate 1 having the resistivity of substantially $1 \times 10^{-7}$ Ω·cm is prepared. Subsequently, for instance, by means of a metal organic chemical vapor deposition (MOCVD) method, on the GaAs substrate 1, an n-type GaAs layer 2 doped with an impurity (such as Si (silicon)) having the n-type conductivity is grown. Subsequently, the n-type GaAs layer 2 in a region other than that where an FET is formed according to a mesa etching method is etched to form an element isolation portion 3. Subsequently, with a photoresist film patterned according to the photolithography technique as a mask, on the n-type GaAs layer 2 in a region where the FET is formed, a AuGe (gold germanium) film, a Ni (nickel) film and a Au (gold) film are sequentially deposited, thereby a source electrode 4 and a drain electrode 5 that form ohmic-contact with the n-type GaAs layer 2 are formed. Then, after the photoresist film that is used to form the source electrode 4 and the drain electrode 5 is removed, with a photoresist film newly patterned according to the photolithography technique as a mask, on the n-type GaAs layer 2 in a region where the FET is formed, a laminated layer containing Pt (platinum) and Au is deposited, thereby a gate electrode 6 that forms Schottky contact with the n-type GaAs layer 2 is formed. According to a process until here, a MESFET (Metal Semiconductor Field Effect Transistor) can be formed. After the formation of the gate electrode 6, the photoresist film is removed.

Figure 2:
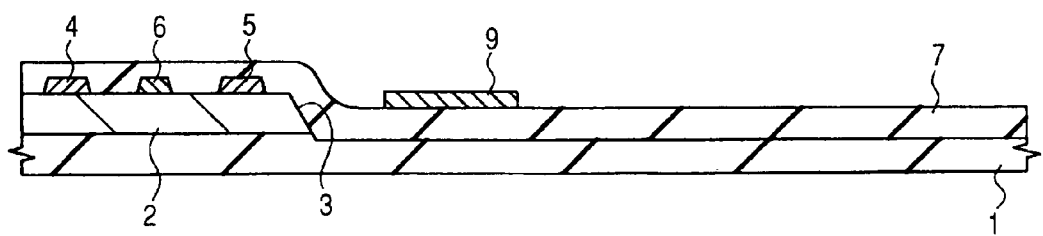
FIG. 2 is subsequent to FIG. 1 and an essential sectional view in the process of manufacture of a semiconductor device.

In the next place, as shown in FIG. 2, according to, for instance, a CVD method, a silicon oxide film 7 having a film thickness of substantially 500 nm is deposited on the GaAs substrate 1. Subsequently, after on the silicon oxide film 7 a WSiN (tungsten nitride silicide) film is deposited, with a photoresist film patterned by means of the photolithography technique as a mask, the WSiN film is etched to form a resistance element 9. After the formation of the resistance element 9, the photoresist film is removed. In the present embodiment 1, a case where the resistance element 9 is formed from a WSiN film is illustrated; however, it may be formed from, in place of the WSiN film, a NiCr (nickel chrome) film.

Figure 3:
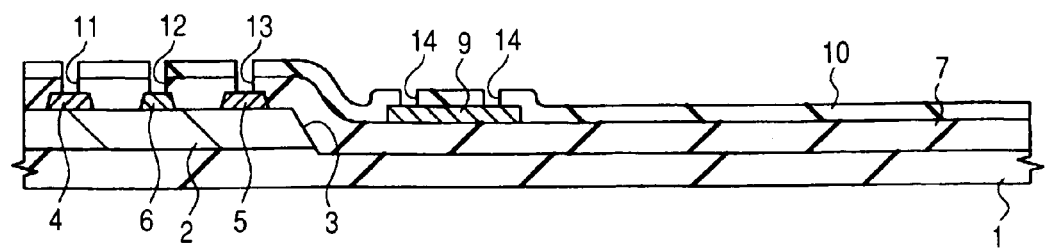
FIG. 3 is subsequent to FIG. 2 and an essential sectional view in the process of manufacture of a semiconductor device.

In the next place, as shown in FIG. 3, for instance, a silicon oxide film 10 is deposited on the GaAs substrate 1. Subsequently, with a photoresist film patterned by means of the photolithography technique as a mask, silicon oxide films 7 and 10 are etched, and thereby an opening 11 that reaches the source electrode 4, an opening 12 that reaches a gate electrode 6, an opening 13 that reaches the drain electrode 5 and an opening 14 that reaches the resistance element 9 are formed.

Figure 4:
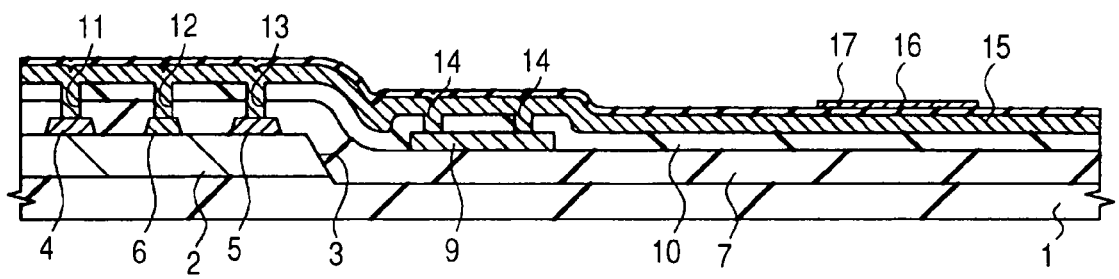
FIG. 4 is subsequent to FIG. 3 and an essential sectional view in the process of manufacture of a semiconductor device.
Figure 5:
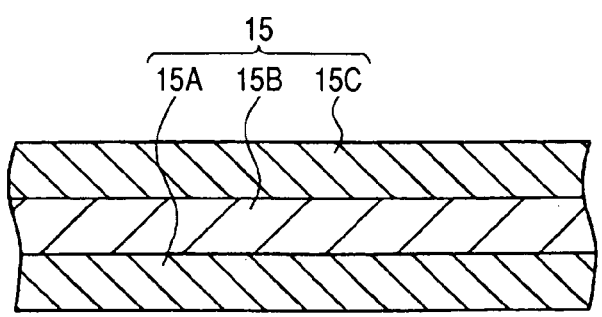
FIG. 5 is an essential sectional view in the process of manufacture of a semiconductor device that is embodiment 1 according to the invention.
Figure 6:
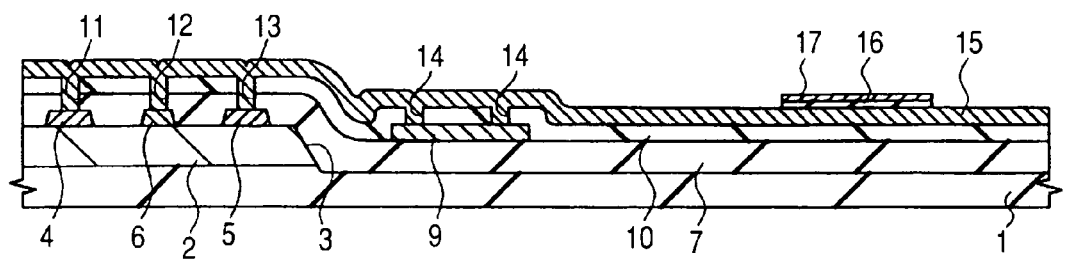
FIG. 6 is an essential sectional view in the process of manufacture of a semiconductor device that is embodiment 1 according to the invention.
Figure 15:
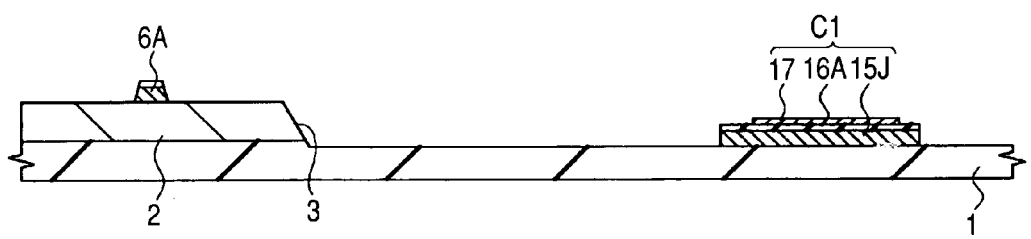
FIG. 15 is subsequent to FIG. 14 and an essential sectional view in the process of manufacture of a semiconductor device.

In the next place, as shown in FIG. 4, a metal film (first conductive film) 15 that buries the openings 11 through 14 is deposited on the silicon oxide film 10. As shown in FIG. 15, the metal film 15 can be formed by sequentially depositing a Mo (molybdenum) film (first metal film) 15A having a film thickness of substantially 0.1 μm, a Au (gold) film (second metal film) 15B having a film thickness of substantially 0.8 μm and a Mo film (third metal film) 15C having a film thickness of substantially 0.1 μm. Furthermore, on an upper portion of the Mo film 15C that is the uppermost layer of the metal film 15, a TiW (titanium tungsten) film may be further laminated. Alternatively, instead of using the Mo film 15A and the Mo film 15C, a Ti (titanium) film, a W (tungsten) film, a TiW film or a WSi (tungsten silicide) film may be used. Subsequently, for instance, on the metal film 15, according to the plasma CVD method, a SiN (silicon nitride) film (first insulating film) 16 having a film thickness of substantially 100 nm is deposited. subsequently, on the SiN film 16, a metal film (second conductive film) having a film thickness of substantially 200 nm is deposited. In the embodiment 1, as the metal film, a TiW film or a WSi film can be illustrated. Subsequently, with a photoresist film patterned by means of the photolithography technique as a mask, the metal film is etched, and thereby an upper electrode 17 of a capacitor element that is formed in a later process is formed. When the upper electrode 17 is formed by means of etching, for instance the dry etching is used. Normally, in the dry etching, the etching is difficult to confine to the processing of the upper electrode 17, thereby, the SiN film 16 as an underlayer, is partially trimmed. This is because in order to completely etch the metal film other than the upper electrode 17, in considering the dispersion in the process owing to a dry etching machine, so-called over-etching is carried out. Furthermore, in some cases, as shown in FIG. 6, the underlying SiN film 16 (first insulating film) may be completely ground or the Mo film 15C further therebelow may be partially ground. In this case, different from a shape shown in a later described FIG. 7, a capacitor insulating film of a capacitor element is planar and formed in a shape substantially same as the upper electrode. Furthermore, other than the dry etching method, by means of a lift-off method due to a photoresist mask, the upper electrode 17 such as Mo may be patterned. In this case, the SiN film 16, without being ground, becomes a cross section same as that shown in FIG. 4.

Figure 7:
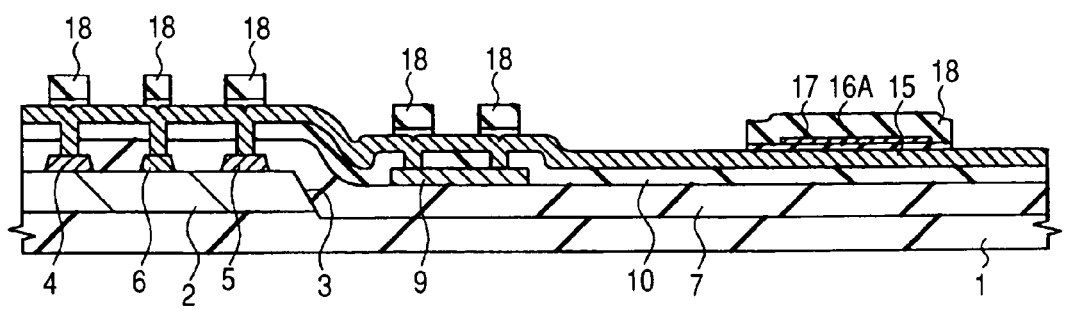
FIG. 7 is subsequent to FIG. 4 and an essential sectional view in the process of manufacture of a semiconductor device.

In the next place, as shown in FIG. 7, on the GaAs substrate 1 a silicon oxide film 18 having a film thickness of substantially 0.8 μm is deposited, and the silicon oxide film (second insulating film) 18 covers the upper electrode 17. In place of the silicon oxide film 18, a SiN film may be used. Subsequently, owing to the etching with a photoresist film patterned by use of the photolithography technique as a mask, the silicon oxide film 18 and the SiN film 16 are patterned. At this time, the Mo film 15C at the uppermost layer of the metal film 15 may be patterned as well. Thereby, a capacitor insulating film 16A of a capacitor element that is formed from the SiN film 16 in a later process can be formed. After the capacitor insulating film 16A is formed, the photoresist film used to form the capacitor insulating film 16A is removed.

Figure 8:
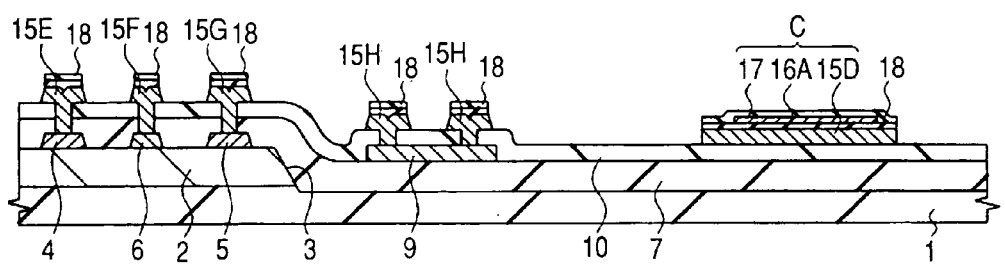
FIG. 8 is subsequent to FIG. 7 and an essential sectional view in the process of manufacture of a semiconductor device.
Figure 9:
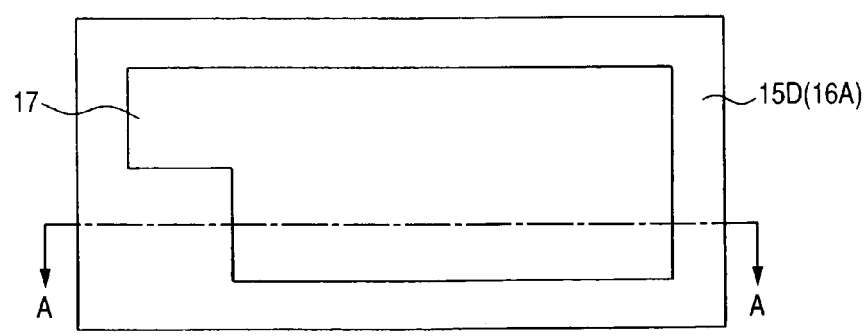
FIG. 9 is an essential plan view in the process of manufacture of a semiconductor device that is embodiment 1 according to the invention.

In the next place, as shown in FIG. 8, with the silicon oxide film 18 as a mask, the sputter etching is applied with an Ar ion to pattern the metal film 15. Thereby, from the metal film 15, a lower electrode 15D of the capacitor element, a wiring 15E electrically connecting with the source electrode 4, a wiring 15F electrically connecting with the gate electrode 6, a wiring 15G electrically connecting with the drain electrode 5 and a wiring 15H electrically connecting with the resistance element 9 can be formed. According to the process until here, a capacitor element C made of the lower electrode 15D, the capacitor insulating film 16A and the upper electrode 17 can be formed. Here, FIG. 9 is a plan view of the capacitor element C and a cross section along an A—A line in FIG. 9 corresponds to a cross section of the capacitor element C in FIG. 8. In the embodiment 1, as shown in FIG. 9, the lower electrode 15D (the capacitor insulating film 16A) is patterned so as to surround the upper electrode 17. At this time, the metal film 15 is patterned by means of the sputter etching. This is because Au that forms the metal film 15 is a material that is difficult to etch according to a chemical reaction. Furthermore, since the metal film 15 is physically etched (sputter etching) to pattern, Au and Mo that form the metal film 15 that is ground by means of the sputter etching are splattered. However, since at the time of patterning the metal film 15 the upper electrode 17 is covered with the silicon oxide film 18, the Au and Mo can be inhibited from inconveniently adhering to the upper electrode 17. Thereby, the upper electrode 17 and the lower electrode 15D can be inhibited from inconveniently causing an electrical short circuit.

In forming the capacitor element, for instance in the case that a lower electrode and a wiring are patterned beforehand, on the lower electrode an interlayer insulating film is formed, and in the interlayer insulating film an opening that reaches the lower electrode is formed, then a capacitor insulating film and an upper electrode being formed in the opening, in particular at the lowermost portion of a sidewall of the opening, the capacitor insulating film bends, a film thickness of the capacitor insulating film becomes thinner or the film quality deteriorates; accordingly, there is fear in that the withstand voltage of the capacitor element may be deteriorated. According to experiments carried out by the inventors, in the case of a capacitor insulating film being deposited with a film thickness of substantially 100 nm, in many cases, the breakdown withstand voltage, which is expected to be substantially 80 to 100 V, becomes substantially 50 V or less. Accordingly, there is fear in that by thinning a film thickness of a capacitor insulating film the capacitance density of the capacitor element may become difficult to improve. On the other hand, according to a method of forming a capacitor element according to the embodiment 1, since, without forming such an opening, the metal film 15 (FIG. 4) that becomes the lower electrode 15D, the SiN film 16 that becomes the capacitor insulating film 16A and the metal film that becomes the upper electrode 17 are successively deposited, the capacitor insulating film can be inhibited from becoming locally thinner. Furthermore, as explained with FIG. 9, since the lower electrode 15D (capacitor insulating film 16A) is planar and patterned so as to surround the upper electrode 17, below the upper electrode 17, the capacitor insulating film 16A can be inhibited from being disposed at an upper portion of a sidewall and at a lower portion of the sidewall of the lower electrode 15D. That is, in the capacitor element C, the withstand voltage of the capacitor element C can be inhibited from deteriorating because the capacitor insulating film 16A bends, the capacitor insulating film 16A becomes locally thinner in a film thickness or the film quality is deteriorated. Thereby, the breakdown withstand voltage of the capacitor element C can be improved. As a result, according to the embodiment 1, by thinning a film thickness of a capacitor insulating film, the capacitance density of the capacitor element can be improved. According to experiments carried out by the inventors, it was found that while in the case of the opening being disposed to form a capacitor element a film thickness of the capacitor insulating film was set at substantially 150 nm, in the case of a capacitor element C according to the embodiment 1 a film thickness of a capacitor insulating film can be set at substantially 100 nm, resulting in an improvement of substantially 1.5 times in the capacitance density. That is, according to the embodiment 1, when a capacitor element C same in the capacitance value as that of a capacitor element formed by disposing an opening is formed, an area that the capacitor element C occupies can be reduced to substantially two thirds.

Furthermore, according to a method of forming a capacitor element C according to the embodiment 1, the metal film 15 that becomes a lower electrode 15D, the SiN film 16 that becomes a capacitor insulating film 16A and the metal film that becomes an upper electrode 17 are successively deposited; accordingly, density of impurities that enter between the lower electrode 15D and the upper electrode 17 can be reduced. Thereby, the capacitance withstand voltage can be inhibited from deteriorating owing to defects caused by the impurities.

Figure 10:
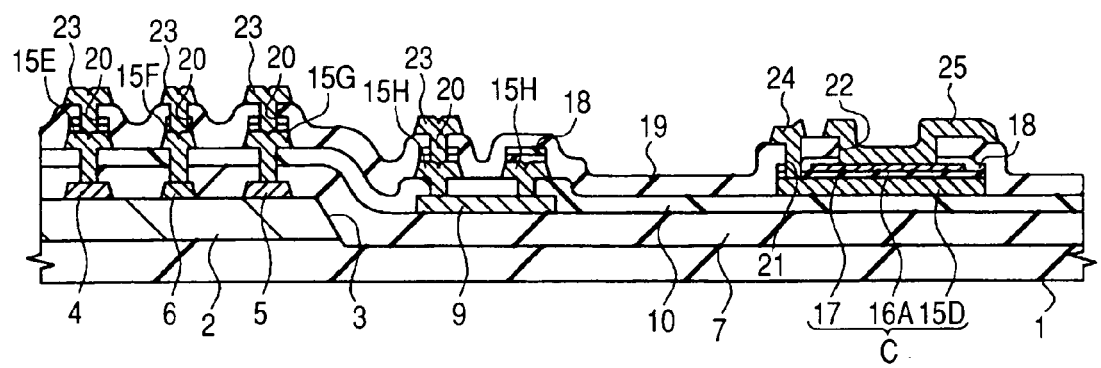
FIG. 10 is subsequent to FIG. 8 and an essential sectional view in the process of manufacture of a semiconductor device.
Figure 11:
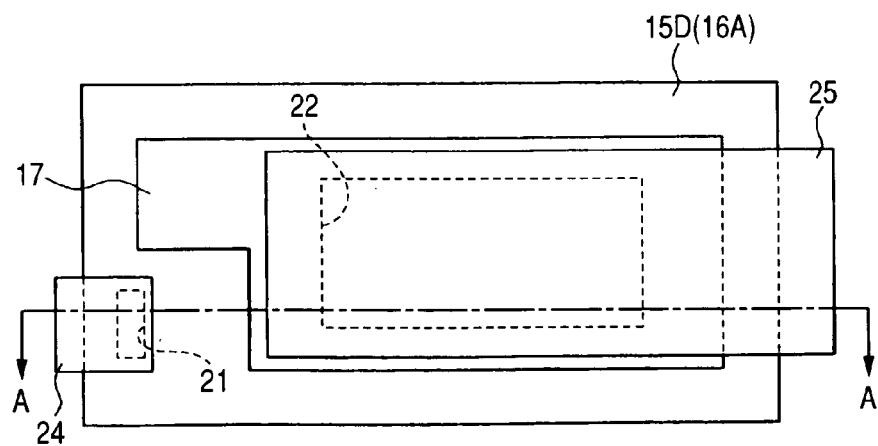
FIG. 11 is subsequent to FIG. 9 and an essential plan view in the process of manufacture of a semiconductor device.

In the next place, as shown in FIG. 10, on the GaAs substrate 1 a SiN film having a film thickness of substantially 0.5 μm and a silicon oxide film having a film thickness of substantially 0.5 μm are successively deposited to form an insulating film (third insulating film) 19. Subsequently, with a photoresist film patterned according to the photolithography technique as a mask, the insulating film 19 is etched, and thereby an opening 20 that reaches each of wirings 15E through 15H, an opening (second opening) 21 that reaches a lower electrode 15D in a region that is planar and where the upper electrode 17 is not disposed and an opening (first opening) 22 that reaches the upper electrode 17 are simultaneously formed. At this time, an opening area of the opening 22 is formed so as to be larger that an opening area of the opening 21. Subsequently, on the insulating film 19 including the insides of the openings 20 through 22, a Mo film having a film thickness of substantially 0.2 μm and a Au film having a film thickness of substantially 3 μm are sequentially deposited. Then, according to the etching with a photoresist film patterned according to the photolithography technique as a mask, the Au film and Mo film are patterned to form a wiring 23 that electrically comes into contact with each of the wirings 15E through 15H, a wiring (second wiring) 24 that electrically comes into contact with the lower electrode 15D and a wiring (first wiring) 25 that electrically comes into contact with the upper electrode. Here, FIG. 11 is a plan view of the capacitor element C in the formation of the wirings 23, 24 and 25 and a cross section along an A—A line in FIG. 11 corresponds to a cross section of the capacitor element C in FIG. 10. As shown in FIG. 11, the opening 22 is formed so as to be planar and surrounded by the upper electrode 17. When the opening 22 is planar and formed at a position deviated from the upper electrode 17, there is fear in that owing to the wiring 25 disposed inside of the opening 22, the upper electrode 17 and lower electrode 15D may be caused to short-circuit. However, when the opening 22 is formed planar and so as to be surrounded with the upper electrode 17, such inconveniences can be inhibited from occurring.

Figure 12:
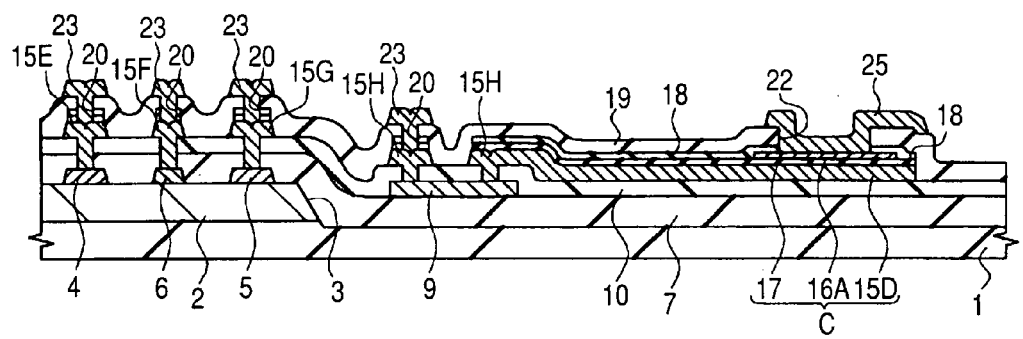
FIG. 12 is an essential sectional view in the process of manufacture of a semiconductor device that is embodiment 1 according to the invention.
Figure 39:
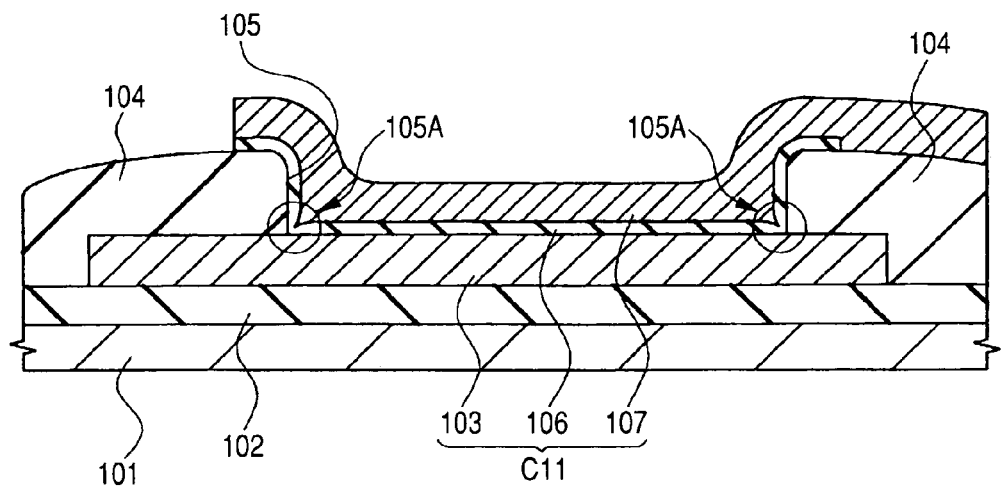
FIG. 39 is an essential sectional view of a semiconductor device that inventors have studied.
Figure 40:
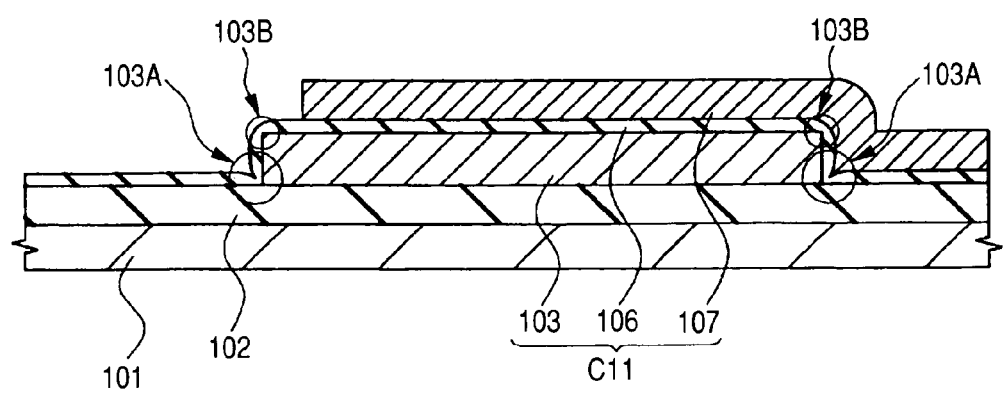
FIG. 40 is an essential sectional view of a semiconductor device that inventors have studied.

In the case of a capacitor element being formed according to a process where, as described in the explanation of FIG. 39, after a lower electrode and a wiring are patterned beforehand, an interlayer insulating film is formed on the lower electrode and an opening 105 that reaches the lower electrode is formed in the interlayer insulating film, a capacitor insulating film and an upper electrode are formed in the opening to form a capacitor element, it becomes difficult to form an opening in which the capacitor insulating film is formed and the opening F that electrically connects in other regions a lower electrode or a wiring in the same layer as the lower electrode in the same process. Here, the opening F corresponds to the opening 20 in the above example. When the opening F and the opening 105 (FIG. 39) of a capacitor portion are tentatively formed simultaneously, since after that the capacitor insulating film is deposited, the capacitor insulating film is deposited also in the opening F. As a result, owing to the capacitor insulating film deposited in the opening, the lower electrode or the wiring in a layer same as the lower electrode and a wiring in a layer thereabove become incapable of electrically connecting. In order to inhibit such inconveniences from occurring, above two openings are demanded to form in separate processes. Alternatively, as a separate idea, a method in which an opening 105 alone is formed beforehand, a capacitor insulating film is formed over an entire surface, and, without patterning the capacitor insulating film, an opening F for electrically connecting a lower electrode or a wiring in a layer same as the lower electrode is formed is considered. In the method, when the opening F is formed, two different layers of the capacitor insulating film and the interlayer insulating film are etched. In the case of the two different layers of the capacitor insulating film and the interlayer insulating film being etched in a lump to form an opening, a shape of the opening to be formed is controlled with difficulty; accordingly, this method is also difficult to apply. Resultantly, it is demanded to etch the capacitor insulating film and the interlayer insulating film in separate processes. That is, an opening for forming a wiring that electrically connects with a lower electrode is demanded to form in two processes. On the other hand, according to the embodiment 1, an opening 21 for forming a wiring 24 that electrically connects with a lower electrode 15D and an opening 20 that reaches each of wirings 15E through 15H can be formed in a process same as that that forms an opening 22 that reaches an upper electrode 17; accordingly, a manufacturing process of a semiconductor device can be simplified. The opening 21 and the wiring 24 for electrically connecting with the lower electrode 15D may be omitted depending on circumstances. For instance, as shown in FIG. 12, the lower electrode 15D may be directly connected to a wiring 15 that connects the resistance element 9 or a wiring 15G of a drain portion.

Furthermore, though omitted from showing in the drawing, a Au film and a Mo film that form wirings 23, 24 and 25 may be patterned in a planar spiral to form an inductor.

Figure 13:
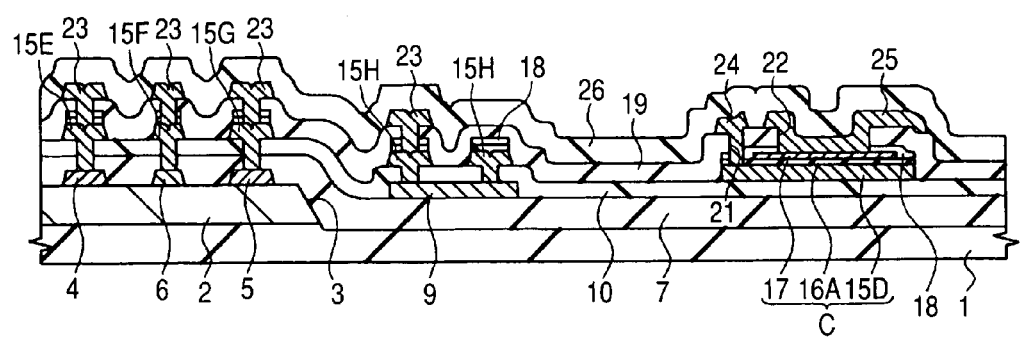
FIG. 13 is subsequent to FIG. 10 and an essential sectional view in the process of manufacture of a semiconductor device.
Figure 14:
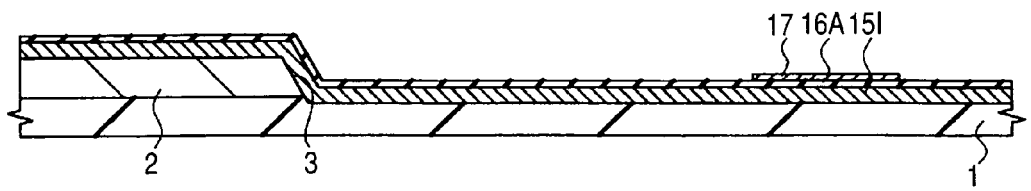
FIG. 14 is an essential sectional view for explaining a manufacturing method of a semiconductor device that is embodiment 2 according to the invention.

In the next place, as shown in FIG. 13, on the GaAs substrate 1, for instance a polyimide resin film is coated and thereby a protective film 26 is formed. Thereafter, the GaAs substrate 1 is cut by means of a dicing method or the like into individual chips to form a semiconductor device according to embodiment 1.

(Embodiment 2)

In a semiconductor device according to present embodiment 2, similarly to the embodiment 1, a FET, a resistance element and a capacitor element are integrated on a substrate. A manufacturing method of the semiconductor device according to the embodiment 2 will be explained with reference to FIGS. 14 through 18.

A manufacturing process of the semiconductor device according to the embodiment 2 is similar up to a process of forming an element isolation layer 3 (FIG. 1) in the embodiment 1. Thereafter, a metal film 15I made of, for instance, a WSi (tungsten silicide) film, a SiN film 16 same as the SiN film 16 in the embodiment 1, and a metal film same as the metal film laminated on the SiN film 16 in the embodiment 1 are successively deposited on a GaAs substrate 1. Subsequently, with a photoresist film patterned according to the photolithography technique as a mask, the metal film is etched, and thereby an upper electrode 17 of a capacitor element that is formed in a later process is formed. After the upper electrode 17 is formed, the photoresist film is removed. A planar pattern of the upper electrode 17 is same as a pattern explained with FIG. 9 in the embodiment 1.

In the next place, as shown in FIG. 15, by means of the dry etching where a photoresist film patterned according to the photolithography technique is used as a mask, the SiN film 16 and the metal film 15I are patterned. Thereby, from the SiN film 16 a capacitor insulating film 16A of a capacitor element can be formed and from the metal film 15I a gate electrode 6A and a lower electrode 15J of the capacitor element can be formed. When the metal film 15I is dry-etched, as an etching gas, for instance, a $SF_6$ gas can be used. Furthermore, planar patterns of the capacitor insulating film 16A and the lower electrode 15J are same as the patterns explained with FIG. 9 in the embodiment 1. According to the process up to here, a capacitor element C1 constituted of the lower electrode 15J, the capacitor insulating film 16A and the upper electrode 17 can be formed. According to the embodiment 2 like this, since the gate electrode 6A and the lower electrode 15J of the capacitor element C1 can be formed in the same process, a manufacturing process of a semiconductor device can be more simplified than the embodiment 1. Furthermore, in the embodiment 1, since the metal film 15 that became the lower electrode 15D (FIG. 8) of the capacitor element C contained a chemically stable Au film 15B (FIG. 7), a physical etching method (sputtering etching) was used to etch the metal film 15. However, in the embodiment 2, the metal film 15I is formed of a WSi film; accordingly, the metal film 15I can be patterned according to the dry etching. In the embodiment 1, a case where the lower electrode 15J and the gate electrode 6A are formed in the same process was explained; however, these may be formed according to separate processes.

Figure 16:
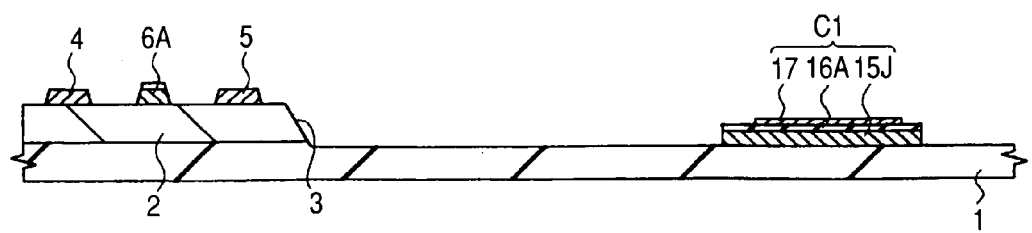
FIG. 16 is subsequent to FIG. 15 and an essential sectional view in the process of manufacture of a semiconductor device.

Next, as shown in FIG. 16, with a photoresist film patterned according to the photolithography technique as a mask, on an n-type GaAs layer 2 in a region where an FET is formed a AuGe (gold germanium) film, a Ni (nickel) film and a Au film are sequentially deposited to form a source electrode 4 and a drain electrode 5 that come into ohmic contact with the n-type GaAs layer 2 same as the embodiment 1. According to a process up to here, a MESFET can be formed. After the source electrode 4 and the drain electrode 5 are formed, the photoresist film is removed.

Figure 17:
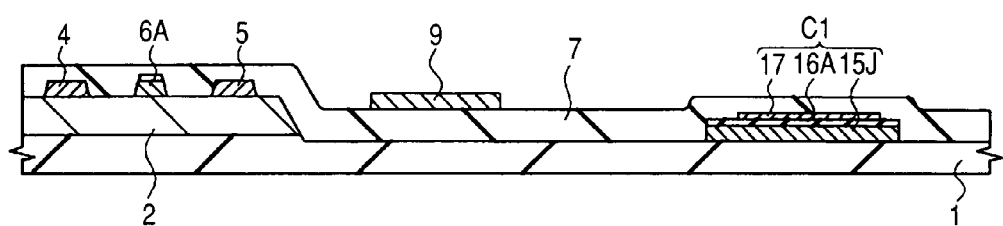
FIG. 17 is subsequent to FIG. 16 and an essential sectional view in the process of manufacture of a semiconductor device.

In the next place, as shown in FIG. 17, on the GaAs substrate 1, a silicon oxide film 7 same as the silicon oxide film 7 in the embodiment 1 is deposited. Subsequently, after WSiN is deposited on the silicon oxide film 7, with a photoresist film patterned by means of the photolithography technique as a mask, the WSiN film is etched, and thereby a resistance element 9 same as the resistance element 9 in the embodiment 1 is formed.

Figure 18:
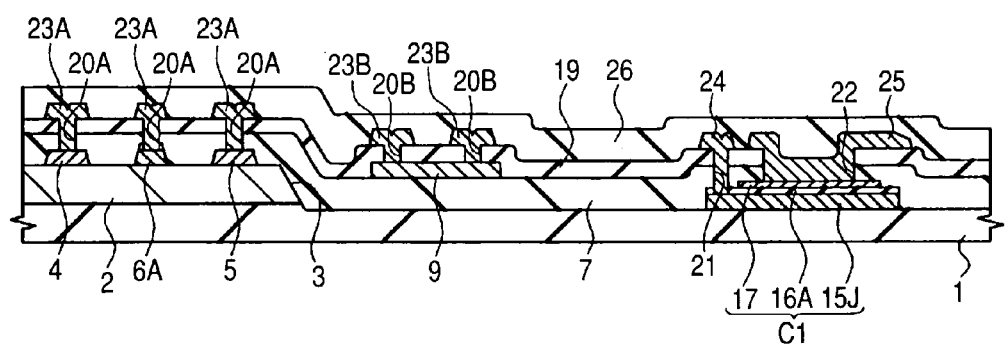
FIG. 18 is subsequent to FIG. 17 and an essential sectional view in the process of manufacture of a semiconductor device.

Subsequently, as shown in FIG. 18, on the GaAs substrate 1, an insulating film 19 same as the insulating film 19 in the embodiment 1 is formed. Subsequently, the insulating film 19 is etched with a photoresist film patterned by means of the photolithography technique as a mask, thereby an opening 20A that reaches each of the source electrode 4, a gate electrode 6A and the drain electrode 5, an opening 20B that reaches a resistance element 9 and openings 21 and 22 same as the openings 21 and 22 in the embodiment 1 are formed. Still subsequently, on the insulating film 19 including the insides of the openings 20A, 20B, 21 and 22, a Mo film having a film thickness of substantially 0.2 μm and a Au film having a film thickness of substantially 3 μm are sequentially formed. Subsequently, by etching with a photoresist film patterned by means of the photolithography technique as a mask, the Au film and the Mo film are patterned to form a wiring 23A that electrically connects with each of the source electrode 4, the gate electrode 6A and the drain electrode 5, a wiring 23B that electrically connects with the resistance element 9, a wiring 24 that electrically connects with the lower electrode 15J and a wiring 25 that electrically connects with the upper electrode. Thereafter, on the GaAs substrate 1, a protective film 26 same as the protective film 26 in the embodiment 1 is formed, thereby a semiconductor device according to the embodiment 2 is manufactured.

The opening 21 and the wiring 24 for electrically connecting with the lower electrode 15J may be omitted in some cases. For instance, the gate electrode 6A is extended and may be directly connected with the lower electrode 15J. In this case, since the opening 21 can be done without, a layout area can be reduced.

Even according to the embodiment 2 as mentioned above, an effect same as the embodiment 1 can be obtained.

(Embodiment 3)

A semiconductor device according to embodiment 3 is one formed by integrating an HBT, a resistance element and a capacitor element on a substrate. A manufacturing process of the semiconductor device according to the embodiment 3 will be explained.

Figure 19:
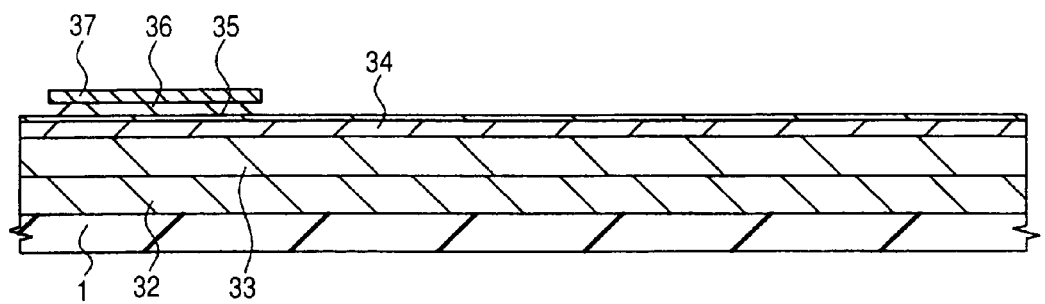
FIG. 19 is an essential sectional view for explaining a manufacturing method of a semiconductor device that is embodiment 3 according to the invention.

Firstly, as shown in FIG. 19, a semi-insulating GaAs substrate 1 having the resistivity of substantially $1\times10^{-7}$ Ω·cm is prepared. Subsequently, according to the MOCVD method, substantially 700 nm of an $n^+$ type (first conductivity type) GaAs layer 32 that becomes a sub-collector layer is grown. Subsequently, on the $n^+$ type GaAs layer 32, an $n^-$ type GaAs layer 33 that becomes a collector layer and a $p^+$ type (second conductivity type) GaAs layer 34 that becomes a base layer are successively formed according to the MOCVD method.

In the next place, an n-type InGaP layer 35 that becomes an emitter layer is deposited according to the MOCVD method, further thereon substantially 400 nm of an $n^+$-type InGaAs layer 36 that becomes an emitter contact layer is formed. The $n^+$-type InGaAs layer 36 is used to establish an ohmic contact with an emitter electrode that is formed in a later process. Thus, for a base ($p^+$ type GaAs layer 34) and an emitter layer (n-type InGaP layer 35), different kinds of semiconductors (hetero-junction) are used.

Subsequently, as a conductive film, for instance, substantially 300 nm of a WSi film is deposited according to the sputtering method. Subsequently, by use of the photolithography technique and the dry-etching technique, the WSi film is processed to form an emitter electrode 37.

Figure 20:
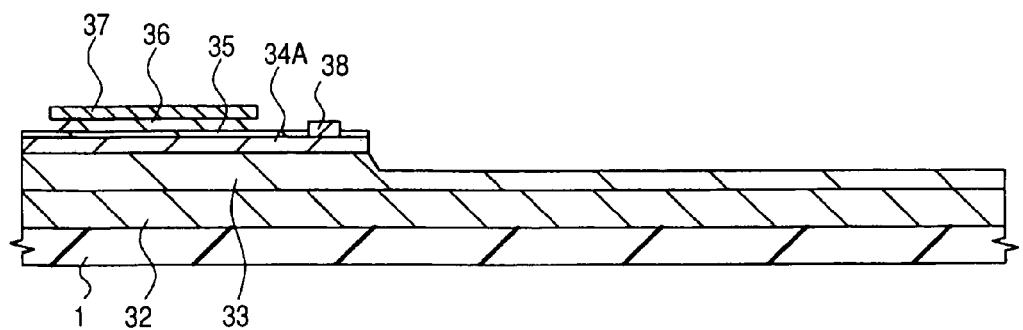
FIG. 20 is subsequent to FIG. 19 and an essential sectional view in the process of manufacture of a semiconductor device.

In the next place, as shown in FIG. 20, with the emitter electrode 37 as a mask, the emitter contact layer ($n^+$-type InGaAs layer 36) is wet-etched to expose the emitter layer (n-type InGaP layer 35). At this time, the emitter layer (n-type InGaP layer 35) may be etched to expose the base layer ($p^+$ type GaAs layer 34).

Subsequently, a base electrode 38 made of a laminated base film in which Pt, Ti (titanium), Mo, Ti and Au are laminated from bottom up is formed. The base electrode 38 is formed according to, for instance, a lift-off method and a thickness thereof is substantially 300 nm. Thereafter, by applying heat treatment (alloying treatment), Pt at the lowermost layer of the base electrode 38 is allowed to react with the emitter layer (n-type InGaP layer 35) and the base layer ($p^+$ type GaAs layer 34). Owing to the reaction portion, the ohmic contact of the base electrode 38 and the base layer ($p^+$ type GaAs layer 34) can be obtained.

Still subsequently, by use of the photolithography technique and the wet etching technique, the emitter layer (n-type InGaP layer 35) and the base layer ($p^+$ type GaAs layer 34) are etched to form a base mesa 34A. As an etching liquid, for instance, a mixed aqueous solution of phosphoric acid and hydrogen peroxide is used. Owing to the etching, the emitter layer (n-type InGaP layer 35) and the base mesa 34A are separated for each of transistors.

Figure 21:
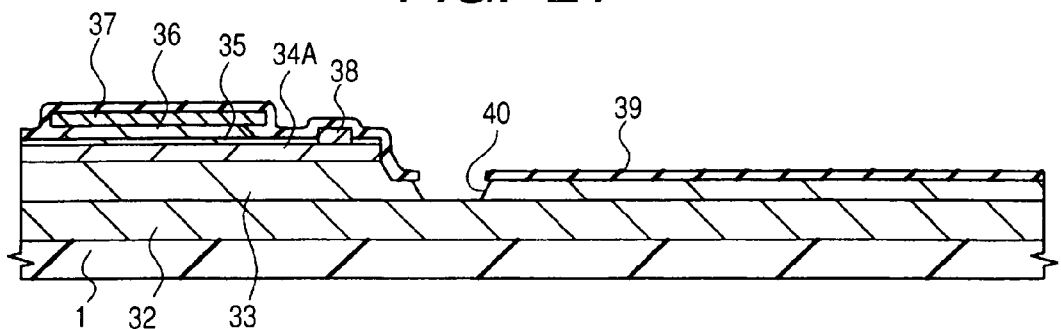
FIG. 21 is subsequent to FIG. 20 and an essential sectional view in the process of manufacture of a semiconductor device.

In the next place, as shown in FIG. 21, substantially 100 nm of an insulating film (such as silicon oxide film) 39 is deposited on the GaAs substrate 1. The insulating film 39, though formed to protect the base electrode 38, may be omitted. Subsequently, the insulating film 39 and the collector layer ($n^-$ type GaAs layer 33) are selectively etched to form an opening (first region) 40 that reaches a sub-collector layer ($n^+$ type GaAs layer 32).

Figure 22:
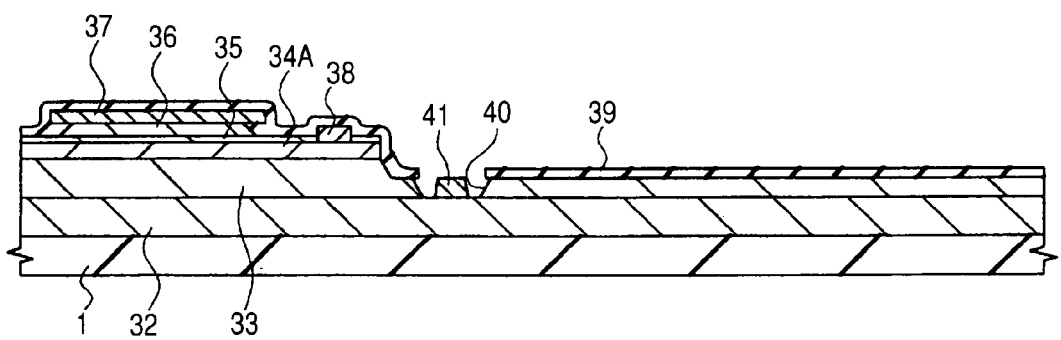
FIG. 22 is subsequent to FIG. 21 and an essential sectional view in the process of manufacture of a semiconductor device.

In the next place, as shown in FIG. 22, with a photoresist film (omitted from showing in the drawing) patterned according to the photolithography technique as a mask, on an entire surface of the GaAs substrate 1, AuGe, Ni and Au are sequentially formed from bottom up, and on an upper portion of the photoresist film and the exposed sub-collector layer ($n^+$ type GaAs layer 32) a laminated film is formed. Subsequently, the photoresist film is removed with a peeling liquid (etching liquid). When the photoresist film is removed thus, the laminated film thereabove is also peeled and the laminated film remains only on part of the sub-collector layer ($n^+$ type GaAs layer 32) to form a collector electrode 41. According to the process up to here, an npn-type HBT according to the embodiment 3 can be formed.

Figure 23:
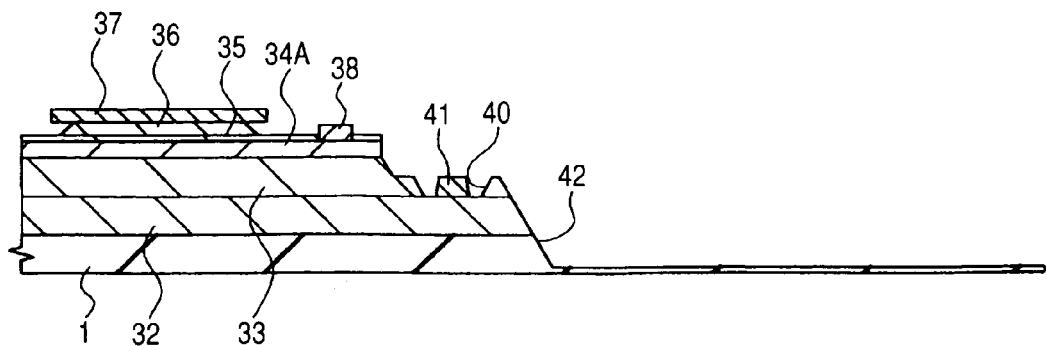
FIG. 23 is subsequent to FIG. 22 and an essential sectional view in the process of manufacture of a semiconductor device.

In the next place, as shown in FIG. 23, the insulating film 39 is removed, the collector layer ($n^-$ type GaAs layer 33) and the sub-collector layer ($n^+$ type GaAs layer 32) outside of the collector electrode 41 are etched to form an element isolation region 42, and thereby the respective HBTs are electrically isolated.

Figure 24:
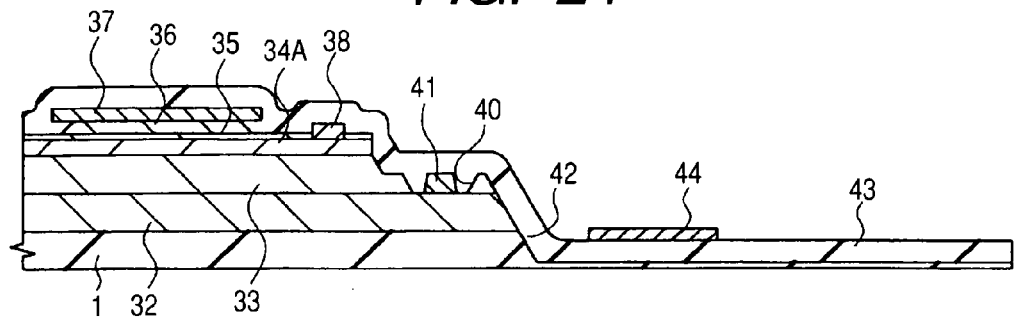
FIG. 24 is subsequent to FIG. 23 and an essential sectional view in the process of manufacture of a semiconductor device.

In the next place, as shown in FIG. 24, on the GaAs substrate 1, an insulating film (such as silicon oxide film) 43 is deposited by means of the CVD method. With the insulating film 39 (FIG. 22) remained, the collector layer ($n^-$ type GaAs layer 33) and the sub-collector layer ($n^+$ type GaAs layer 32) are etched to electrically separate the respective HBTs, thereby the insulating film 43 may be formed on the insulating film 39.

Subsequently, after WSiN is deposited on, for instance, the insulating film 43, with a photoresist film patterned according to the photolithography technique as a mask, the WSiN film is etched to form a resistance element 44. In the embodiment 3, a case where the resistance element 44 is formed from a WSiN film is shown. However, in place of the WSiN film, it may be formed from a NiCr film.

Figure 25:
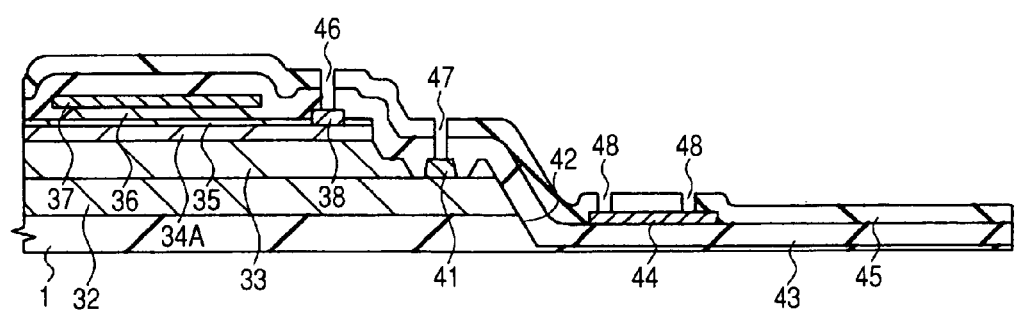
FIG. 25 is subsequent to FIG. 24 and an essential sectional view in the process of manufacture of a semiconductor device.

In the next place, as shown in FIG. 25, on the GaAs substrate 1, an insulating film 45 (such as silicon oxide film) is deposited. Subsequently, with a photoresist film patterned according to the photolithography technique as a mask, the insulating films 45 and 43 are etched and thereby an opening (omitted from showing in the drawing) that reaches the emitter electrode 37, an opening 46 that reaches the base electrode 38, an opening 47 that reaches the collector electrode 41 and an opening 48 that reaches the resistance element 44 are formed.

Figure 26:
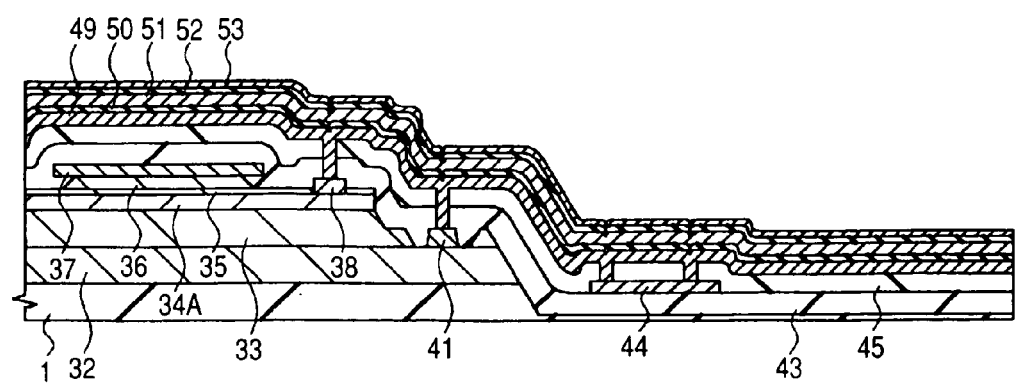
FIG. 26 is subsequent to FIG. 25 and an essential sectional view in the process of manufacture of a semiconductor device.

In the next place, as shown in FIG. 26, on the insulating film 45, a metal film 49 that buries the openings 46 through 48 (FIG. 25) and has a film thickness of substantially 1 μm, an insulating film 50 having a film thickness of substantially 100 nm, a metal film 51 having a film thickness of substantially 1 μm, an insulating film 52 having a film thickness of substantially 100 nm and a metal film 53 having a film thickness of substantially 200 nm are sequentially deposited. The metal films 49 and 51 can be formed by sequentially depositing, for instance, a Mo film having a film thickness of substantially 0.1 μm, a Au film having a film thickness of substantially 0.8 μm and a Mo film having a film thickness of substantially 0.1 μm. The insulating films 50 and 52 can be formed by depositing from bottom up a silicon oxide film, a SiN film and a silicon oxide film. The metal film 53 can be formed by depositing a WSi film having a film thickness of, for instance, substantially 200 nm. In the embodiment 3, in a later process, from these metal film 49, insulating film 50, metal film 51, insulating film 52 and the metal film 53, a capacitor element that has three-stages of first through third stages of capacitor electrodes and a capacitor insulating film made of the insulating film 50 or the insulating film 52 between the respective electrodes is formed.

Figure 27:
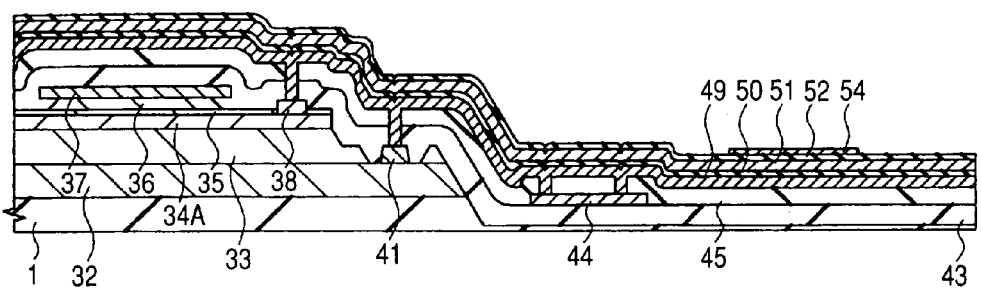
FIG. 27 is subsequent to FIG. 26 and an essential sectional view in the process of manufacture of a semiconductor device.

In the next place, as shown in FIG. 27, with a photoresist film patterned according to the photolithography technique as a mask, the metal film 53 is etched, thereby a third capacitor electrode 54 of a capacitor element that is formed in a later process is formed.

Figure 28:
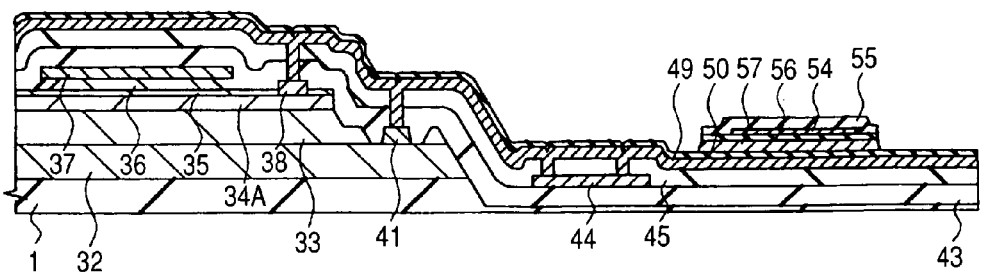
FIG. 28 is subsequent to FIG. 27 and an essential sectional view in the process of manufacture of a semiconductor device.

In the next place, as shown in FIG. 28, on the GaAs substrate 1, a silicon oxide film 55 having a film thickness of substantially 0.8 μm is deposited and the third capacitor electrode 54 is covered with the silicon oxide film 55. In place of the silicon oxide film 55, a SiN film may be used. Subsequently, according to the etching with a photoresist film patterned according to the photolithography technique as a mask, the silicon oxide film 55 and the insulating film 52 are patterned. Thereby, from the insulating film 52, a second capacitor insulating film 56 of the capacitor element can be formed.

Figure 29:
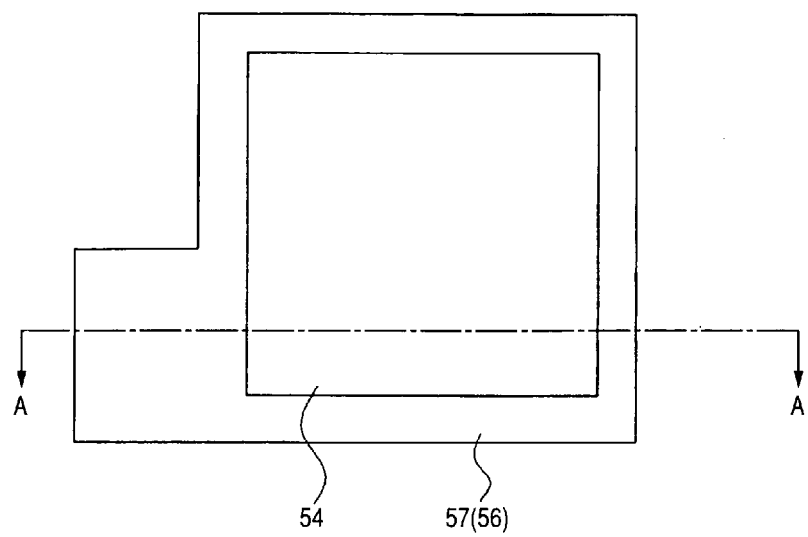
FIG. 29 is an essential plan view in the process of manufacture of a semiconductor device that is embodiment 3 according to the invention.

Subsequently, with the silicon oxide film 55 as a mask, the sputtering etching due to Ar ion is performed to pattern the metal film 51. Thereby, from the metal film 51, a second capacitor electrode 57 of the capacitor element can be formed. FIG. 29 is a plan view showing positional relationship between the third capacitor electrode 54, the second capacitor insulating film 56 and the second capacitor electrode 57 when the second capacitor electrode 57 is formed, a cross section along an A—A line in FIG. 29 corresponding to a cross section of the third capacitor electrode 54, the second capacitor insulating film 56 and the second capacitor electrode 57 in FIG. 28. In the embodiment 3, as shown in FIG. 29, the second capacitor electrode 57 (capacitor insulating film 56) is planar and patterned so as to surround the third capacitor electrode 54. At this time, the reason for the metal film 51 being patterned by means of the sputter etching is because Au that forms the metal film 51 is a material difficult to etch owing to a chemical reaction. Furthermore, since the metal film 51 is patterned by physically etching (sputter etching), Au and Mo that form the metal film 51 that is ground by means of the sputter etching are splattered. However, during the patterning of the metal film 51, since the third capacitor electrode 54 is covered with the silicon oxide film 55, the Au and Mo can be inhibited from causing inconveniences of adhering to the third capacitor electrode 54. Thereby, the third capacitor electrode 54 and the second capacitor electrode 57 can be inhibited from causing inconveniences of causing electrical short circuit.

Figure 30:
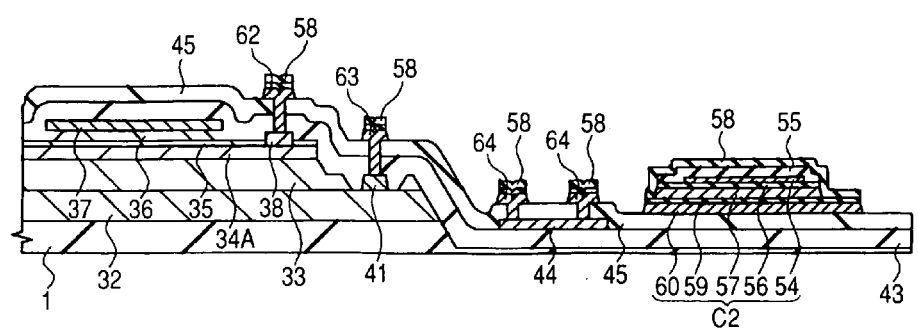
FIG. 30 is subsequent to FIG. 28 and an essential sectional view in the process of manufacture of a semiconductor device.

In the next place, as shown in FIG. 30, on the GaAs substrate 1, a silicon oxide film 58 having a film thickness of substantially 0.8 μm is deposited, and with the silicon oxide film 58 the silicon oxide film 55, the third capacitor electrode 54, the second capacitor insulating film 56 and the second capacitor electrode 57 are covered. In place of the silicon oxide film 58, a SiN film may be used. Subsequently, by means of the etching in which a photoresist film patterned according to the photolithography technique is used as a mask, the silicon oxide film 55 and the insulating film 50 are patterned. Thereby, from the insulating film 50, a first capacitor insulating film 59 of the capacitor element can be formed.

Figure 31:
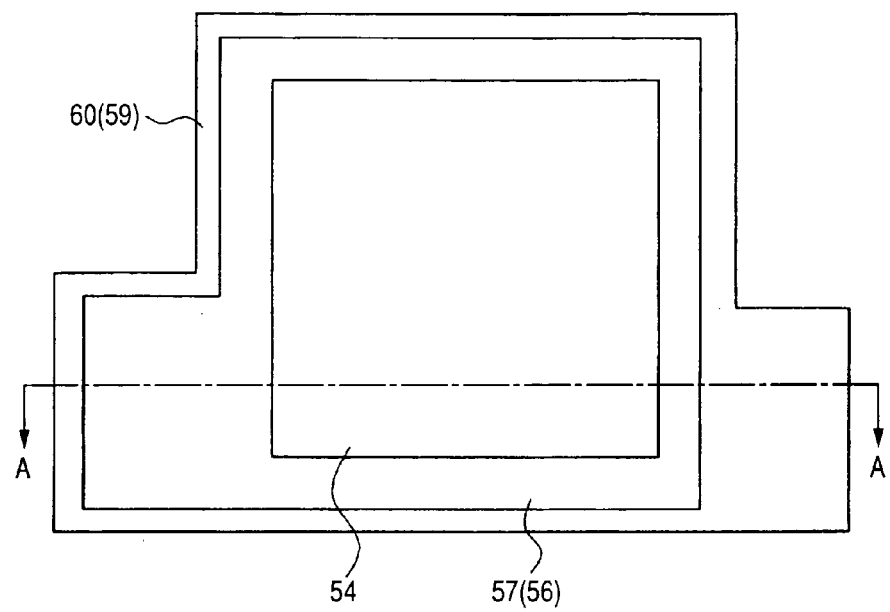
FIG. 31 is subsequent to FIG. 29 and an essential sectional view in the process of manufacture of a semiconductor device.

Subsequently, with the silicon oxide film 58 as a mask, the sputter etching due to Ar ion is performed to pattern the metal film 49. Thereby, from the metal film 49, a first capacitor electrode 60 of the capacitor element, a wiring (omitted from showing in the drawing) that electrically connects with the emitter electrode 37, a wiring 62 that electrically connects with the base electrode 38, a wiring 63 that electrically connects with the collector electrode 41 and a wiring 64 that electrically connects with the resistance element 44 can be formed. According to the process up to here, a capacitor element C2 that is made of the first capacitor electrode 60, the first capacitor insulating film 59, the second capacitor electrode 57, the second capacitor insulating film 56 and the third capacitor electrode 54 can be formed. FIG. 31 is a plan view showing positional relationship between the first capacitor electrode 60, the first capacitor insulating film 59, the second capacitor electrode 57, the second capacitor insulating film 56 and the third capacitor electrode 54 when the first capacitor electrode 60 is formed, a cross section along an A—A line in FIG. 31 corresponding to a cross section of the capacitor element C2 in FIG. 30. In the embodiment 3, as shown in FIG. 31, the first capacitor electrode 60 (capacitor insulating film 59) is planar and patterned so as to surround the second capacitor electrode 57. At this time, the reason for the metal film 49 being patterned by means of the sputter etching is because Au that forms the metal film 49 is, similarly to the metal film 51, a material difficult to etch owing to a chemical reaction. Furthermore, since the metal film 51 is patterned, similarly to the metal film 51, by physically etching (sputter etching), Au and Mo that form the metal film 49 that was ground by means of the sputter etching are splattered. However, during the patterning of the metal film 49, since the third capacitor electrode 54 is covered with the silicon oxide film 55 and the silicon oxide film 58 and the second capacitor electrode 57 is covered with the silicon oxide film 58, the Au and Mo can be inhibited from causing inconveniences of adhering to the third capacitor electrode 54 and the second capacitor electrode 57. Thereby, the first capacitor electrode 60 can be inhibited from causing inconveniences of causing electrical short circuit with the second capacitor electrode 57 and the third capacitor electrode 54.

In the embodiment 3, a case where the capacitor element C2 has three stages of capacitor electrodes (first capacitor electrode 60, second capacitor electrode 57 and third capacitor electrode 54) was explained; however, according to a similar process a capacitor element having four or more stages of capacitor electrodes may be formed. Thus, in the case of a capacitor element that has (n+1) (n is 2 or more) stages of capacitor electrodes being formed, firstly, metal films and insulating films from which all of capacitor electrodes and capacitor insulating films are formed are formed, and after the formation of these thin films according to a patterning method same as the patterning method with the silicon oxide films 55 and 58 as masks, the thin films are patterned sequentially from top to down. Thereby, even in the case of a capacitor element having (n+1) stages of capacitor electrodes being formed, the inconvenience that the respective capacitor electrodes cause electrical short circuit therebetween can be inhibited.

Furthermore, as explained with FIGS. 29 and 31, since the first capacitor electrode 60 (first capacitor insulating film 59) is planar and patterned so as to surround the second capacitor electrode 57 (second capacitor insulating film 56) and the second capacitor electrode 57 (second capacitor insulating film 56) is planar and patterned so as to surround the third capacitor electrode 54, below the third capacitor electrode 54 the second capacitor insulating film 57 can be inhibited from being disposed at upper and lower portions of a sidewall of the second capacitor electrode 57 and below the second capacitor electrode 57 the first capacitor insulating film 59 can be inhibited from being disposed at upper and lower portions of a sidewall of the first capacitor electrode 60. Thereby, it can be inhibited that the first capacitor insulating film 59 and the second capacitor insulating film 56 bend, the first capacitor insulating film 59 and the second capacitor insulating film 56 become locally thinner in the film thickness or deteriorate in the film quality, and thereby the withstand voltage of the capacitor element C2 becomes lower. As a result, since the breakdown withstand voltage of the capacitor element C2 can be improved, the capacitance density of the capacitor element can be improved by thinning a film thickness of the capacitor insulating film. That is, according to the embodiment 3, even in the case of a capacitor element having (n+1) stages of capacitor electrodes being formed, since the capacitor insulating film can be inhibited from becoming locally thinner or deteriorating in the film quality, the breakdown withstand voltage of the capacitor element can be improved.

Still furthermore, according to the forming method according to the embodiment 3 of a capacitor element, since the metal films that become (n+1) stages of capacitor electrodes and the capacitor insulating films disposed between the respective metal films are sequentially deposited, density of foreign matters that come in between the metal films and the capacitor insulating films can be reduced. Thereby, the deterioration of the capacitor withstand voltage caused by defects due to the foreign matters can be inhibited from occurring.

Figure 32:
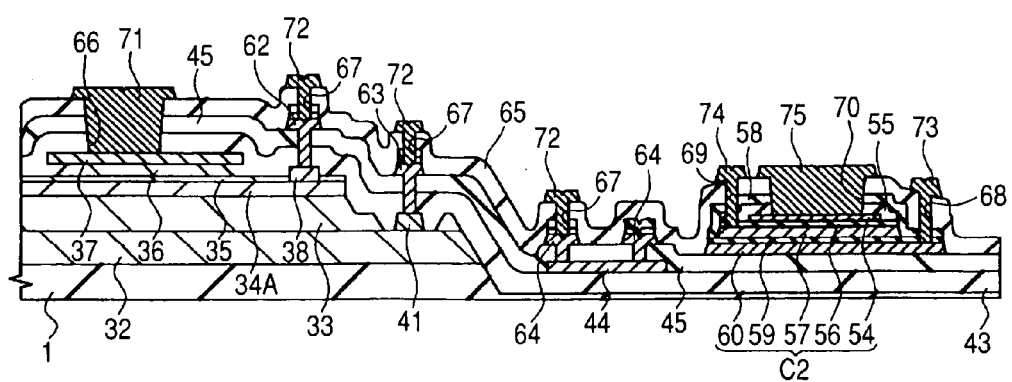
FIG. 32 is subsequent to FIG. 30 and an essential sectional view in the process of manufacture of a semiconductor device.

In the next place, as shown in FIG. 32, on the GaAs substrate 1, a SiN film having a film thickness of substantially 0.5 µm and a silicon oxide film having a film thickness of substantially 0.5 µm are sequentially deposited to form an insulating film 65. Subsequently, with a photoresist film patterned according to the photolithography technique as a mask, the insulating films 65, 45 and 43 are etched, and thereby an opening 66 that reaches the emitter electrode 37, openings 67 that reach each of the wirings 62 through 64, an opening 68 that reaches the first capacitor electrode 60 in a region that is planar and where the second capacitor electrode 57 and the third capacitor electrode 54 are not disposed, an opening 69 that reaches the second capacitor electrode 57 in a region that is planar and where the third capacitor electrode 54 is not disposed and an opening 70 that reaches the third capacitor electrode 54 are formed. At this time, an opening area of the opening 70 is formed so as to be larger than that of the openings 68 and 69.

Figure 33:
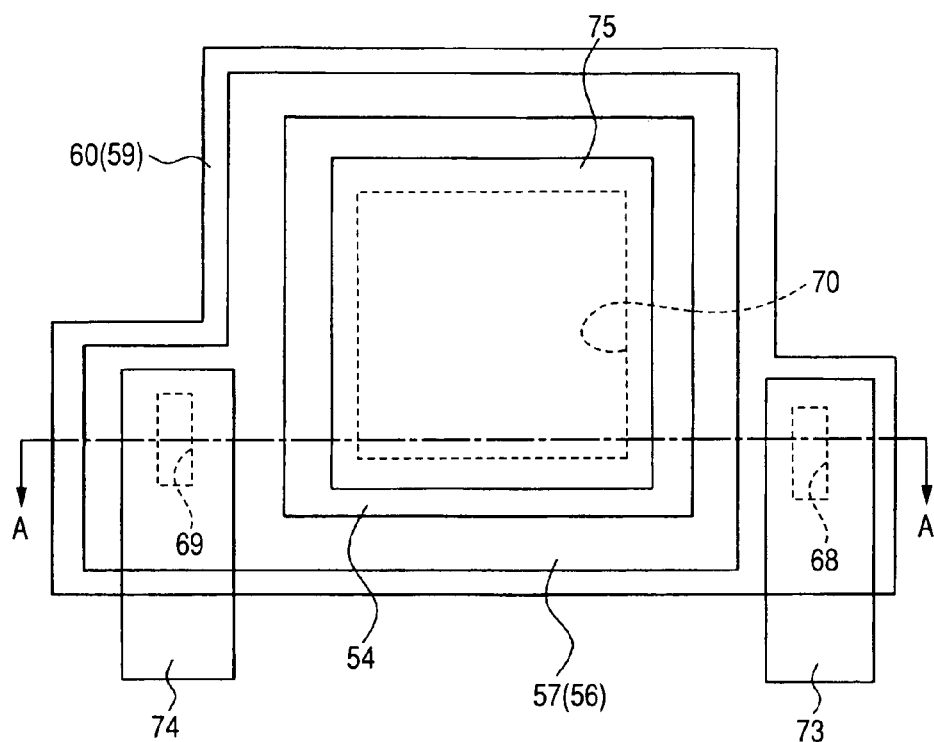
FIG. 33 is subsequent to FIG. 31 and an essential sectional view in the process of manufacture of a semiconductor device.

Subsequently, on the insulating film 65 including the insides of the openings 66 through 70, a Mo film having a film thickness of substantially 0.2 µm and a Au film having a film thickness of substantially 3 µm are sequentially deposited. Still subsequently, according to the etching in which a photoresist film patterned according to the photolithography technique is used as a mask, the Au film and the Mo film are patterned to form a wiring 71 that electrically connects with the emitter electrode 37, wirings 72 that electrically connect with each of the wirings 62 through 64, a wiring 73 that electrically connects with the first capacitor electrode 60, a wiring 74 that electrically connects with the second capacitor electrode 57, and a wiring 75 that electrically connects with the third capacitor electrode 54 are formed. Here, FIG. 33 is a plan view of the capacitor element C2 when the wirings 71 through 75 are formed, and a cross section along an A—A line in FIG. 33 corresponds to a cross section of the capacitor element C2 in FIG. 32. As shown in FIG. 33, the opening 70 is formed so as to be planar and surrounded by the third capacitor electrode 54, and the opening 69 is formed so as to be planar and surrounded by the second capacitor electrode 57. When the opening 70 is formed planar and at a position deviated from the third capacitor electrode 54, there is fear in that owing to the wiring 75 disposed inside of the opening 70 the third capacitor electrode 54 may be caused to short-circuit with the second capacitor electrode 57 and the first capacitor electrode 60, and when the opening 69 is formed planar and deviated from the second capacitor electrode 57, there is fear in that owing to the wiring 74 disposed inside of the opening 69 the second capacitor electrode 57 and the first capacitor electrode 60 may be caused to short circuit. However, when the opening 70 is formed so as to be planar and surrounded by the third capacitor electrode 54 and the opening 69 is formed so as to be planar and surrounded by the second capacitor electrode 57, such inconveniences can be inhibited from occurring.

The present inventors studied means of forming a capacitor element C2 according to a process in which, in forming a capacitor element C2, for instance a first capacitor electrode 60 and wirings 61, 62 and 63 are patterned beforehand; on the first capacitor electrode 60 and the wirings 61, 62 and 63 an interlayer insulating film is formed; after in the interlayer insulating film an opening that reaches the first capacitor electrode 60 is formed, in the opening thereof a first capacitor insulating film 59 and a second capacitor electrode 57 are formed (including the patterning); further on the first capacitor insulating film 59 and the second capacitor electrode 57 an interlayer insulating film is formed; and after an opening that reaches the second capacitor electrode 57 is formed in the interlayer insulating film, in the opening thereof the second capacitor insulating film 56 and the third capacitor electrode 54 are formed (including the patterning). In the case of such means being used, in comparison with a manufacturing method of the capacitor element C2 according to the embodiment 3, a process of forming an opening for forming the first capacitor insulating film 59 and the second capacitor electrode 57, a process of patterning the first capacitor insulating film 59, a process of forming an opening for forming the second capacitor insulating film 56 and the third capacitor electrode 54 and a process of patterning the second capacitor insulating film 56 are added. In this case, the capacitor element C2 becomes a three-layered structure of wiring, a metal layer that is simultaneously formed with the second capacitor electrode 57 is used also as a second wiring, and a metal layer formed simultaneously with the third capacitor electrode 54 is used also as a third wiring. Accordingly, normally, on the third wiring at the uppermost layer a protective insulating film is formed and in the protective insulating film an opening for forming a bonding-pad and so on is formed. On the other hand, according to the manufacturing method according to the embodiment 3 of the capacitor element C2, since the number of the wiring layer may be two and these processes can be omitted, a manufacturing process of a semiconductor device can be simplified. Furthermore, in forming a capacitor electrode having an n-stages of laminated capacitor insulating film and (n+1) stages of capacitor electrode, even when n is 3 or more, in comparison with an existing technique in which a (n+1) layered wiring layer is necessary, according to the embodiment 3, since the wiring layer can do with two layers, a process can be simplified.

Figure 34:
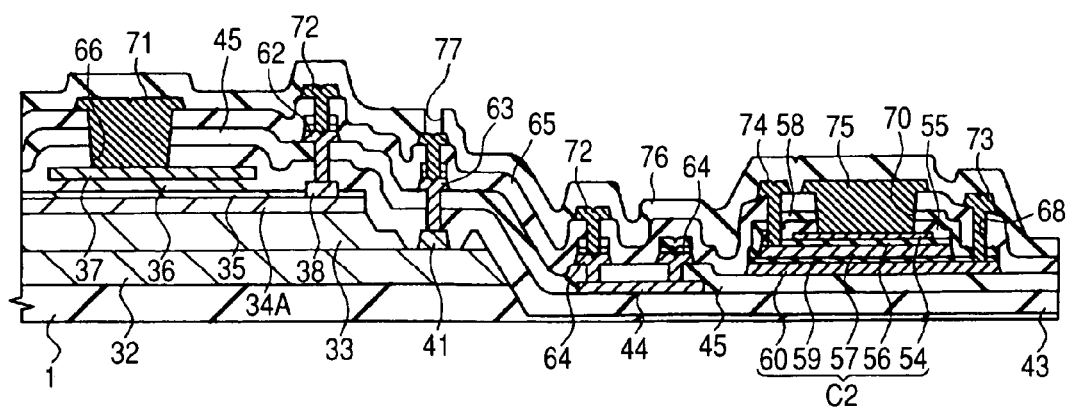
FIG. 34 is subsequent to FIG. 32 and an essential sectional view in the process of manufacture of a semiconductor device.

In the next place, as shown in FIG. 34, after an insulating film 76 is deposited on the GaAs substrate 1, an opening 77 that reaches wirings 71 through 75 is formed. In the embodiment 3, as the insulating film 76, a SiN film or a laminated film in which a silicon oxide film and a SiN film are sequentially deposited can be illustrated. Thereafter, the GaAs substrate 1 is cut by means of the dicing method or the like into individual chips, thereby semiconductor devices according to the embodiment 3 are manufactured.

In FIGS. 32 and 34 of the embodiment 3, the opening 68 that reaches the first capacitor electrode 60 is disposed to derive upward by use of the second wiring 73; however, the wiring 73 is not necessarily required. The first wiring simultaneously formed with the first capacitor electrode 60 may be connected with the wiring 64 that connects with the resistance element 44 or the wiring 62 that connects with the base electrode 38. On the other hand, the opening 69 and the wiring 74 that reach the second capacitor electrode 57 cannot be omitted because the second capacitor electrode 57 and the wiring 74 are electrically connected. When the procedure is repeated to form a capacitor element having an n-stage laminated capacitor insulating film, even in the case of n being 3 or more, according to the embodiment 3, a wiring layer can do with two layers.

Figure 35:
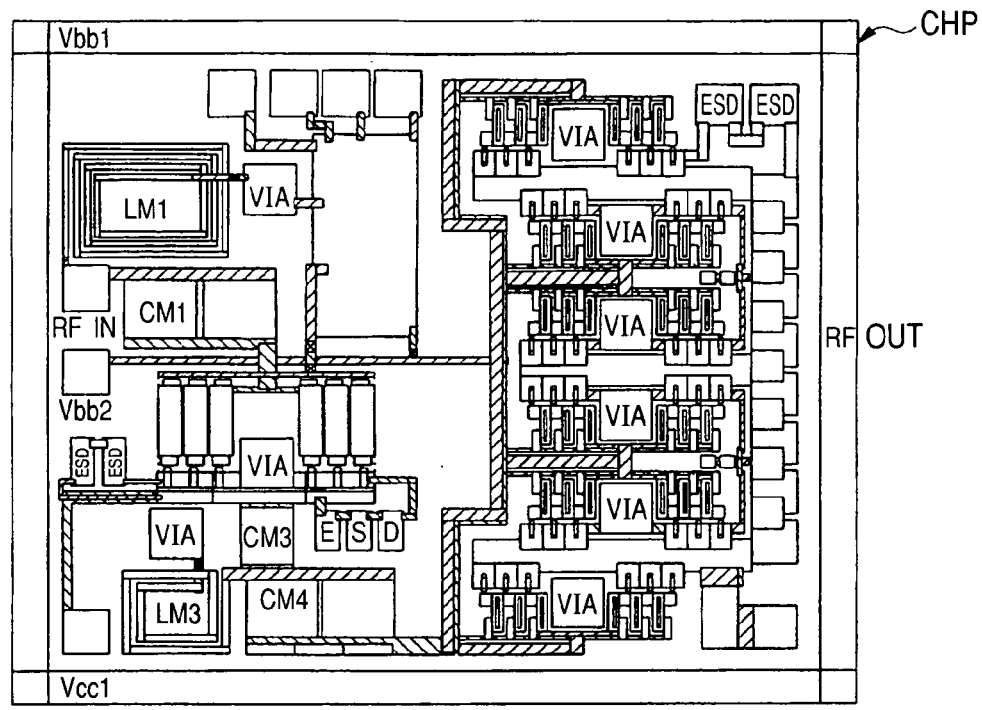
FIG. 35 is a plan view of a chip that forms a semiconductor device that is embodiment 3 according to the invention.
Figure 36:
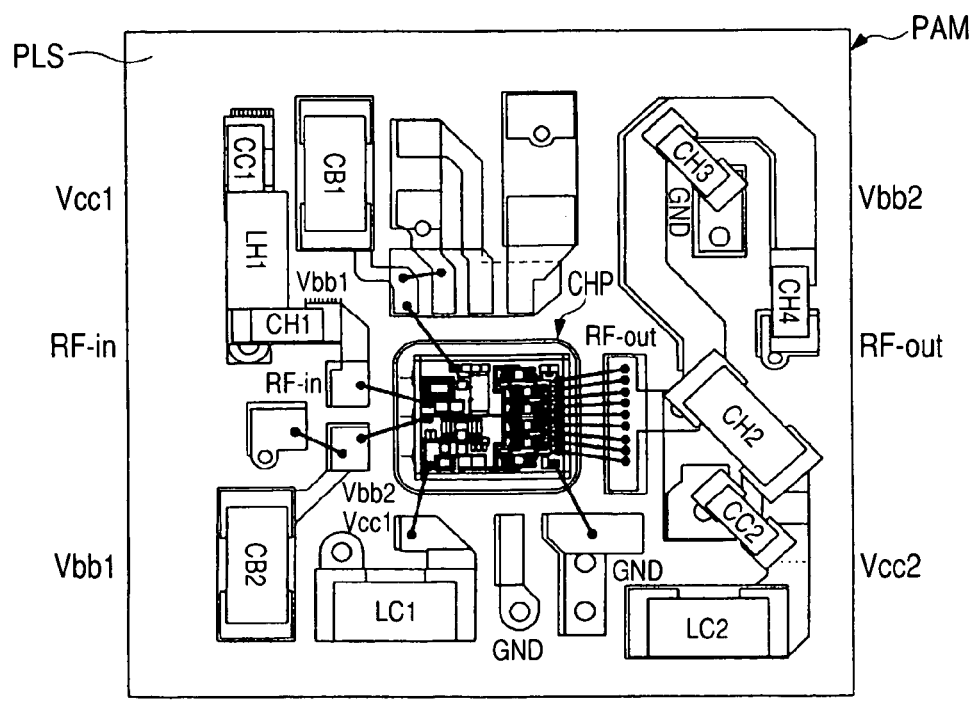
FIG. 36 is an essential plan view of a high-frequency power amplifier including a chip shown in FIG. 35.
Figure 37:
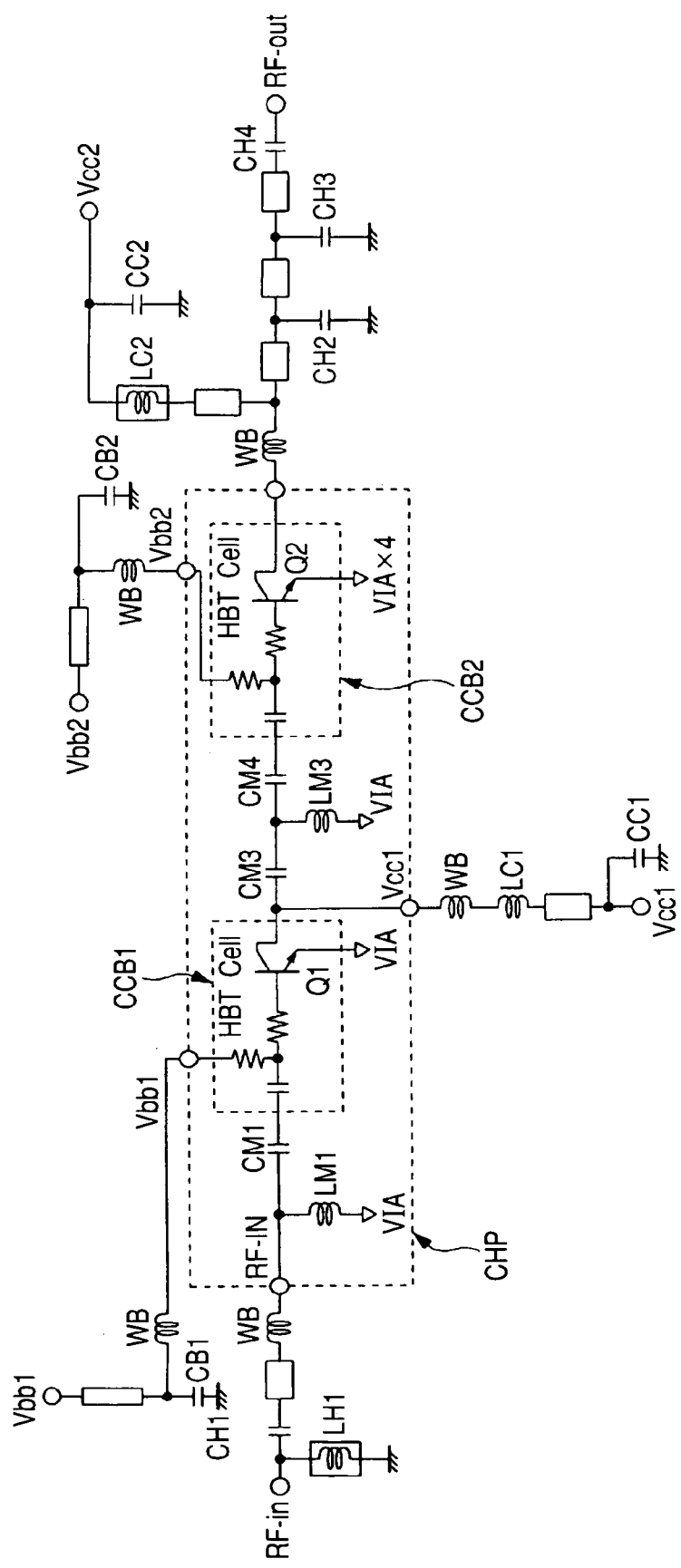
FIG. 37 is an essential circuit diagram of a high-frequency power amplifier shown in FIG. 36.

FIG. 35 is a plan view of the chip. As shown in FIG. 35, on a chip CHP, other than the HBT, resistance element 44 and capacitor element C2 all according to the present embodiment, capacitor elements CM1, CM3 and CM4 and inductors LM1 and LM3 are formed. Though omitted from showing in the drawing, the capacitor elements CM1, CM3 and CM4 are formed according to the process and in the shape same as that of the capacitor element C2. FIG. 36 is an essential plan view of a high-frequency power amplifier that is formed by mounting the chip CHP shown in FIG. 35 on a wiring board, FIG. 37 being an essential circuit diagram of the high-frequency power amplifier. The high-frequency power amplifier is a transmission power amplification module (second module) PAM corresponding to, for instance, a GMS (Global System for Mobile Communication) system of a working frequency of substantially 800 to 900 MHz, a DCS (Digital Cellular System) system of a working frequency of substantially 1.8 to 1.9 GHz or both of these. On a wiring board PLS that forms the transmission power amplification module PAM, other than the chip CHP, capacitors CB1, CB2, CC1, CC2, CH1 and CH2 and inductors LC1, LC2, LH1 and WB are mounted. The capacitors CB1, CB2, CC1, CC2, CH1, CH2, CH3 and CH4 and inductors LC1, LC2, LH1 and WB are individual chips that are directly assembled on the wiring board PLS according to, for instance, a face-down bonding method.

External electrode terminals in the transmission power amplification module PAM are an RF-in as input terminal, an RF-out as output terminal, Vcc1 and Vcc2 as reference potential (power source potential) and Vbb1 and Vbb2 as bias terminal.

Between the RF-in and the RF-out, two amplification stages are connected in cascade. A first amplification stage and a second amplification stage, respectively, are formed of a first circuit block CCB1 and a second circuit block CCB2.

The RF-in is electrically connected through a predetermined inter-stage matching circuit to a base electrode of an HBTQ1 contained in the first circuit block CCB. The HBTQ1 amplifies a high-frequency power. Furthermore, the inter-stage matching circuit thereof is formed of the capacitor element CM1 and the inductor LM1. An amplification system is constituted into two stages; accordingly, a base electrode of an HBTQ2 that is contained in the second circuit block CCB2 that is a second amplification stage is connected through a predetermined inter-stage matching circuit to a collector electrode of the HBTQ1 in the former stage. The inter-stage matching circuit disposed between the HBTQ1 and HBTQ2 is formed of the capacitor elements CM3 and CM4 and the inductor LM3.

(Embodiment 4)

In the embodiment 3, a case where the capacitors CB1, CB2, CC1, CC2, CH1, CH2, CH3 and CH4 (FIG. 36) are formed as chips that are directly assembled to the wiring board PLS was illustrated; however, in the present embodiment 4, a case where the capacitors (passive elements) CB1, CB2, CC1, CC2, CH1, CH2, CH3 and CH4 are formed in one chip as an integrated passive device (IPD) (first module) will be explained.

Figure 38:
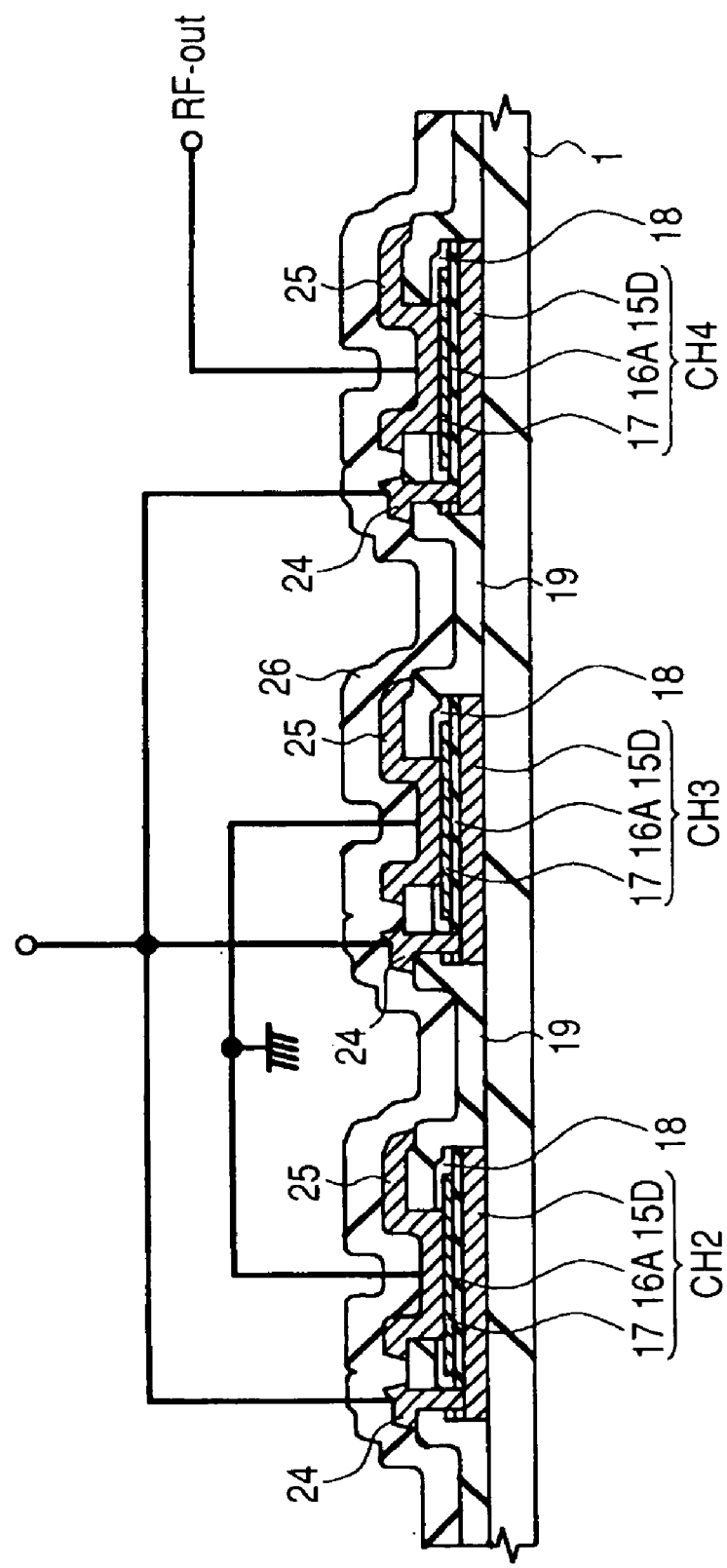
FIG. 38 is an essential sectional view for explaining a semiconductor device that is embodiment 3 according to the invention.

FIG. 38 is an essential sectional view of the integrated passive device and capacitors CH2, CH3 and CH4 are shown in particular. The capacitors CH2, CH3 and CH4 are formed, on a GaAs substrate 1, according to a process same as the process that forms the capacitor element C explained by use of FIGS. 4 through 13 in the embodiment 1. When the capacitors CB1, CB2, CC1, CC2, CH1, CH2, CH3 and CH4 are thus formed in one chip as the integrated passive device, in comparison with a case where the capacitors CB1, CB2, CC1, CC2, CH1, CH2, CH3 and CH4 are respectively assembled as individual chips in the transmission power amplification module PAM (FIG. 36), the capacitors can be assembled more compactly. Thereby, the transmission power amplification module PAM itself can be made in a smaller size.

According to the above-mentioned embodiment 4 as well, an effect same as the embodiment 1 can be obtained.

In the above, the invention achieved by the inventors was specifically explained based on the embodiments; however, it goes without saying that the present invention, without restricting to the above embodiments, can be variously modified within a range that does not deviate from gist of the invention.

For instance, in the embodiment 1, a case where a FET is formed on a GaAs substrate was explained; however, in place of the GaAs substrate, a semi-insulating compound semiconductor substrate such as InP may be used. Furthermore, in the embodiment 4, an insulator substrate mainly made of silicon oxide or aluminum oxide such as a quartz substrate or an alumina substrate may be used. Since the quartz substrate and the alumina substrate are less expensive than GaAs and so on, a manufacturing cost of the IPD can be reduced. From a viewpoint of high-frequency characteristics of a MIM (Metal Insulator Metal) capacitor, in comparison with a semiconductor substrate relatively high in the conductivity such as silicon, a semi-insulating compound substrate is preferably used and an insulator substrate such as quartz is more preferably used.

A semiconductor device according to the present invention can be applied to a high-frequency power amplifier such as a transmission power amplification module.

What is claimed is:

1. A manufacturing method of a semiconductor device, comprising the steps of:
   (a) sequentially depositing over a substrate made of a semiconductor substrate or an insulator substrate a first conductive film, a first insulating film and a second conductive film;
   (b) patterning the second conductive film to form an upper electrode; and
   (c) after the step (b), patterning the first conductive film to form a lower electrode and thereby forming a capacitor element including an upper electrode, a capacitor insulating film and a lower electrode,
   wherein the capacitor element and a bipolar transistor are formed over the substrate,
   the bipolar transistor being formed by a process comprising the steps of:
   (g1) forming a first conductivity type collector layer over the substrate;
   (g2) forming a second conductivity type base layer over the collector layer;
   (g3) forming a first conductivity type emitter layer over the base layer;
   (g4) forming an emitter electrode that electrically connects with the emitter layer over the emitter layer;
   (g5) etching the emitter layer;
   (g6) after the step of (g5), forming a base electrode that electrically connects with the base layer over the base layer;
   (g7) after the step of (g5), patterning the base layer to expose a first region of the collector layer; and
   (g8) in the first region, forming a collector electrode that electrically connects with the collector layer.

2. The manufacturing method of a semiconductor device according to claim 1, comprising the steps of:
   (b1) after the step (b) and before the step (c), patterning the first insulating film to form the capacitor insulating film,
   wherein the first conductive film and the second conductive film have a metal as a main component.

3. The manufacturing method of a semiconductor device according to claim 2,
   wherein the first conductive film is formed according to a process comprising the steps of:
   (a1) forming a first metal film over the substrate;
   (a2) forming a second metal film over the first metal film; and
   (a3) forming a third metal film over the second metal film, and
   wherein the second metal film comprises gold as a main component, and
   wherein the first metal film and the third metal film comprise at least one kind of element selected from molybdenum, titanium, tungsten, titanium tungsten or tungsten silicide as a main component.

4. The manufacturing method of a semiconductor device according to claim 2,
   wherein the semiconductor substrate has GaAs or InP as a main component; and
   the insulator substrate has silicon oxide or aluminum oxide as a main component.

5. The manufacturing method of a semiconductor device according to claim 1,
   wherein the step (c) comprises the steps of
   (c1) forming a second insulating film over the substrate; and
   (c2) patterning the second insulating film.

6. The manufacturing method of a semiconductor device according to claim 5,
   wherein the step (c) comprises the step of (c1) etching the first conductive film with the second insulating film as a mask to pattern the first conductive film,
   wherein the first conductive film comprises gold, and
   wherein the second insulating film has silicon oxide or silicon nitride as a main component.

7. The manufacturing method of a semiconductor device according to claim 1,
   wherein the second conductive film and the first insulating film are patterned so that in a plane an outer periphery of the upper electrode is disposed more inside than an outer periphery of the lower electrode; further comprising, subsequent to the step (c), the steps of:
   (d) forming a third insulating film over the substrate;
   (e) forming a first opening that reaches the upper electrode over the third insulating film over the upper electrode; and
   (f) forming in the first opening a first wiring that electrically connects with the upper electrode.

8. The manufacturing method of a semiconductor device according to claim 1,
   wherein the second conductive film is patterned so that in a plane an outer periphery of the upper electrode is disposed more inside than an outer periphery of the lower electrode; further comprising, subsequent to the step (c), the steps of:
   (d) forming a third insulating film over the substrate;
   (e) forming, in the third insulating film over the upper electrode, a first opening that reaches the upper electrode and, in a region that is planar and where the upper electrode is not located, and forming in the third insulating film and the capacitor insulating film over the lower electrode, a second opening that reaches the lower electrode; and
   (f) forming in the first opening a first wiring that electrically connects with the upper electrode, and in the second opening a second wiring that electrically connects with the lower electrode.

9. The manufacturing method of a semiconductor device according to claim 1,
   wherein the upper electrode, the capacitor insulating film and the lower electrode are formed so as to be flat over the substrate.

* * * * *